United States Patent
Scarbrough et al.

(10) Patent No.: US 12,288,585 B2
(45) Date of Patent: Apr. 29, 2025

(54) INTEGRATED CIRCUITRY COMPRISING A MEMORY ARRAY COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); John D. Hopkins, Meridian, ID (US); Purnima Narayanan, Boise, ID (US); Vinayak Shamanna, Boise, ID (US); Justin D. Shepherdson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 791 days.

(21) Appl. No.: 17/396,056

(22) Filed: Aug. 6, 2021

(65) Prior Publication Data

US 2023/0039517 A1    Feb. 9, 2023

(51) Int. Cl.
*H10B 41/10* (2023.01)
*G11C 16/04* (2006.01)
(Continued)

(52) U.S. Cl.
CPC ......... *G11C 16/0483* (2013.01); *H10B 41/10* (2023.02); *H10B 41/27* (2023.02);
(Continued)

(58) Field of Classification Search
CPC ........ H10B 43/27; H10B 41/27; H10B 41/30; H10B 43/30; H10B 43/40; H10B 43/10;
(Continued)

(56) References Cited

U.S. PATENT DOCUMENTS

2022/0285386 A1* 9/2022 Said ...................... H10B 43/10

* cited by examiner

*Primary Examiner* — Moin M Rahman
(74) *Attorney, Agent, or Firm* — Wells St. John P.S.

(57) ABSTRACT

A method used in forming a memory array comprising strings of memory cells comprises forming a lower portion of a stack that will comprise vertically-alternating conductive tiers and insulative tiers. The stack comprises laterally-spaced memory-block regions. The lower portion comprises multiple lower of the conductive tiers and multiple lower of the insulative tiers. The lower insulative tiers comprise insulative material. The lower conductive tiers comprise sacrificial material that is of different composition from that of the insulative material. The sacrificial material is replaced with conducting material. After the replacing of the sacrificial material, the vertically-alternating conductive tiers and insulative tiers of an upper portion of the stack are formed above the lower portion. The upper portion comprises multiple upper of the conductive tiers and multiple upper of the insulative tiers. The upper insulative tiers comprise insulating material. The upper conductive tiers comprise sacrifice material that is of different composition from that of the conducting material, the insulating material, and the insulative material. The sacrifice material is replaced with conductive material. Other embodiments, including structure independent of method, are disclosed.

15 Claims, 25 Drawing Sheets

(51) Int. Cl.
  *H10B 41/27* (2023.01)
  *H10B 41/35* (2023.01)
  *H10B 43/10* (2023.01)
  *H10B 43/27* (2023.01)
  *H10B 43/35* (2023.01)

(52) U.S. Cl.
  CPC ............ *H10B 41/35* (2023.02); *H10B 43/10* (2023.02); *H10B 43/27* (2023.02); *H10B 43/35* (2023.02)

(58) Field of Classification Search
  CPC ........ H10B 43/50; H10B 41/35; H10B 41/50; H10B 43/35; H10B 41/41; H10B 41/10; H10B 41/20; H10B 41/40; H10B 41/44; H10B 41/43; H10B 41/42; H10B 43/00; H10B 43/20; H10B 43/23; H10B 51/00; H10B 51/10; H10B 51/20; H10B 51/30; H10B 51/40; H10B 51/50; H10B 53/10; H10B 53/20; H10B 53/22; H10B 63/30; H10B 63/32; H10B 63/34; H10B 63/80; H10B 63/84; H10B 99/00; H10B 99/10; H10B 99/22; H01L 23/5226; H01L 23/528; H01L 29/41775; H01L 29/42324; H01L 29/4234; H01L 21/02532; H01L 21/02636; H01L 21/31111; H01L 21/31155; H01L 21/76802; H01L 21/76877; H01L 21/76897; H01L 29/40114; H01L 29/40117; H01L 29/66545; H01L 29/7883; H01L 21/76831; H01L 21/76805; H01L 29/78; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/823828; H01L 27/0922; H01L 29/167; H01L 29/66636; H01L 29/7851; H01L 29/66795; H01L 29/7846; H01L 29/785; H01L 29/165; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485
  See application file for complete search history.

INTEGRATED CIRCUITRY COMPRISING A MEMORY ARRAY COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to integrated circuitry comprising a memory array comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-27.

Figure 1:
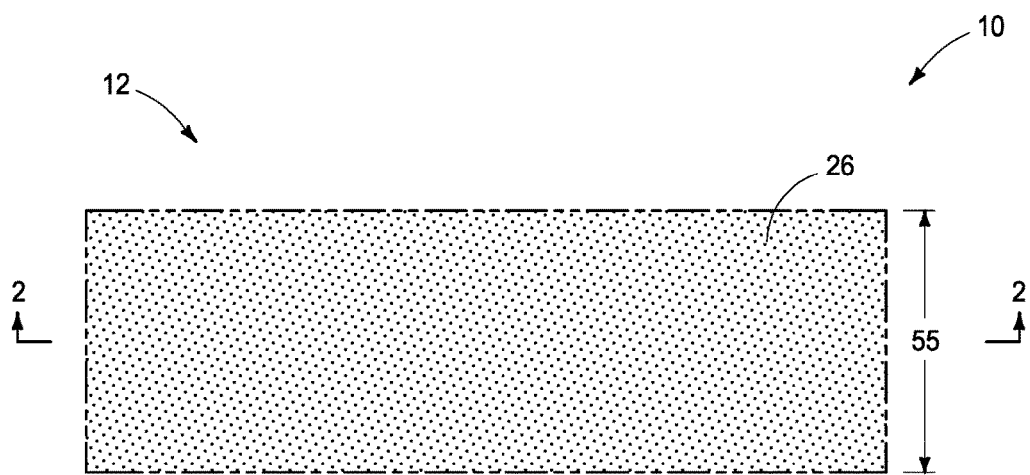
FIG. 1 is a diagrammatic cross-sectional view of a portion of a substrate in process in accordance with an embodiment of the invention and is taken through line 1-1 in FIG. 2.
Figure 2:
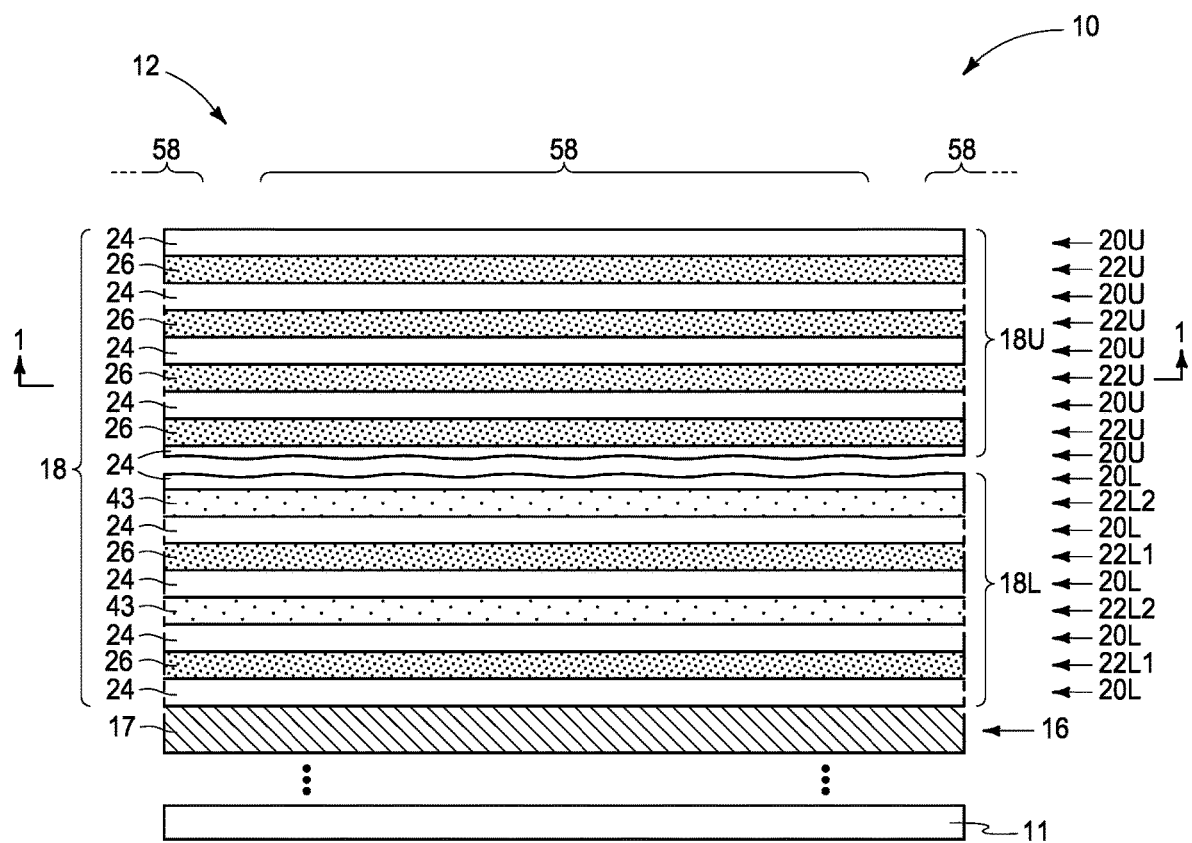
FIG. 2 is a diagrammatic cross-sectional view taken through line 2-2 in FIG. 1.
Figure 3:
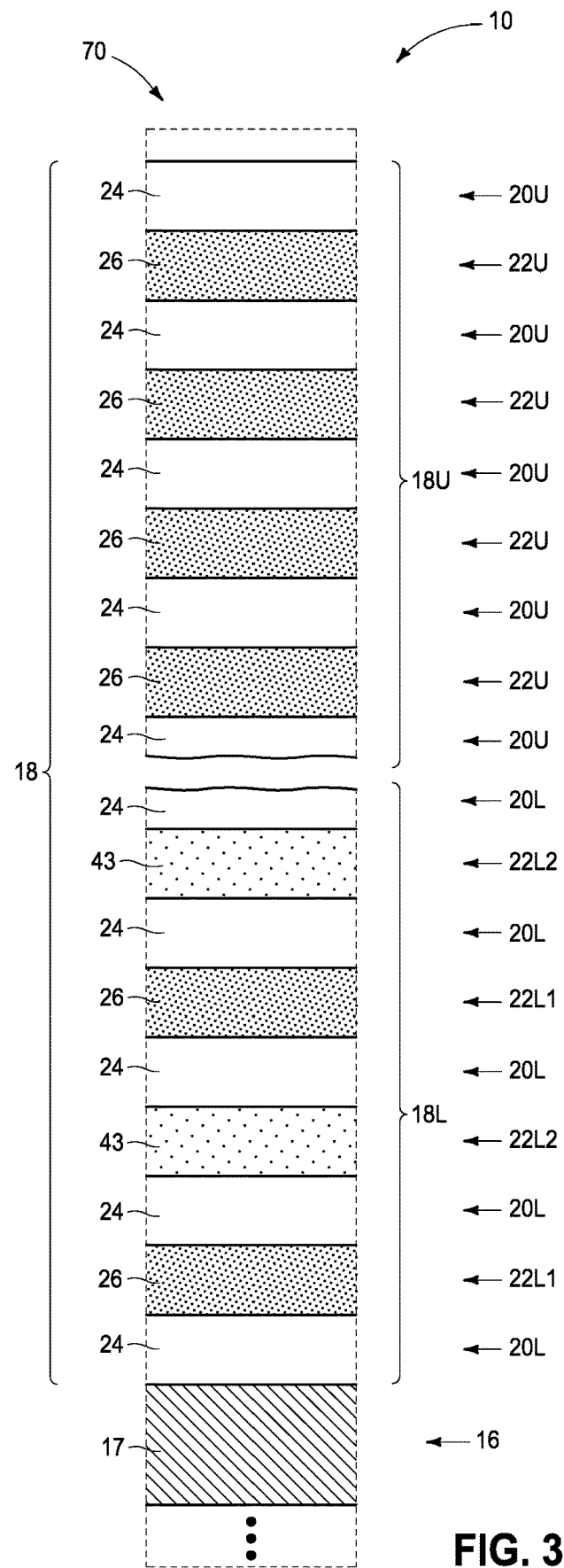
FIG. 3 is a diagrammatic cross-sectional view of another portion of a substrate in process in accordance with an embodiment of the invention
Figure 4:
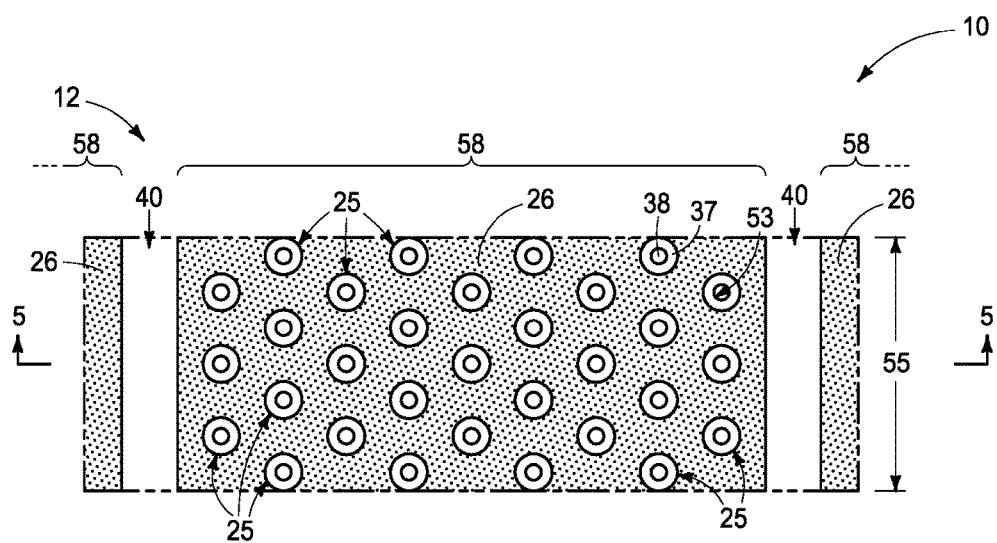
FIGS. 4-27 are diagrammatic sequential sectional, expanded, enlarged, and/or partial views of the constructions of FIGS. 1-3, or portions thereof, in process in accordance with some embodiments of the invention.
Figure 5:
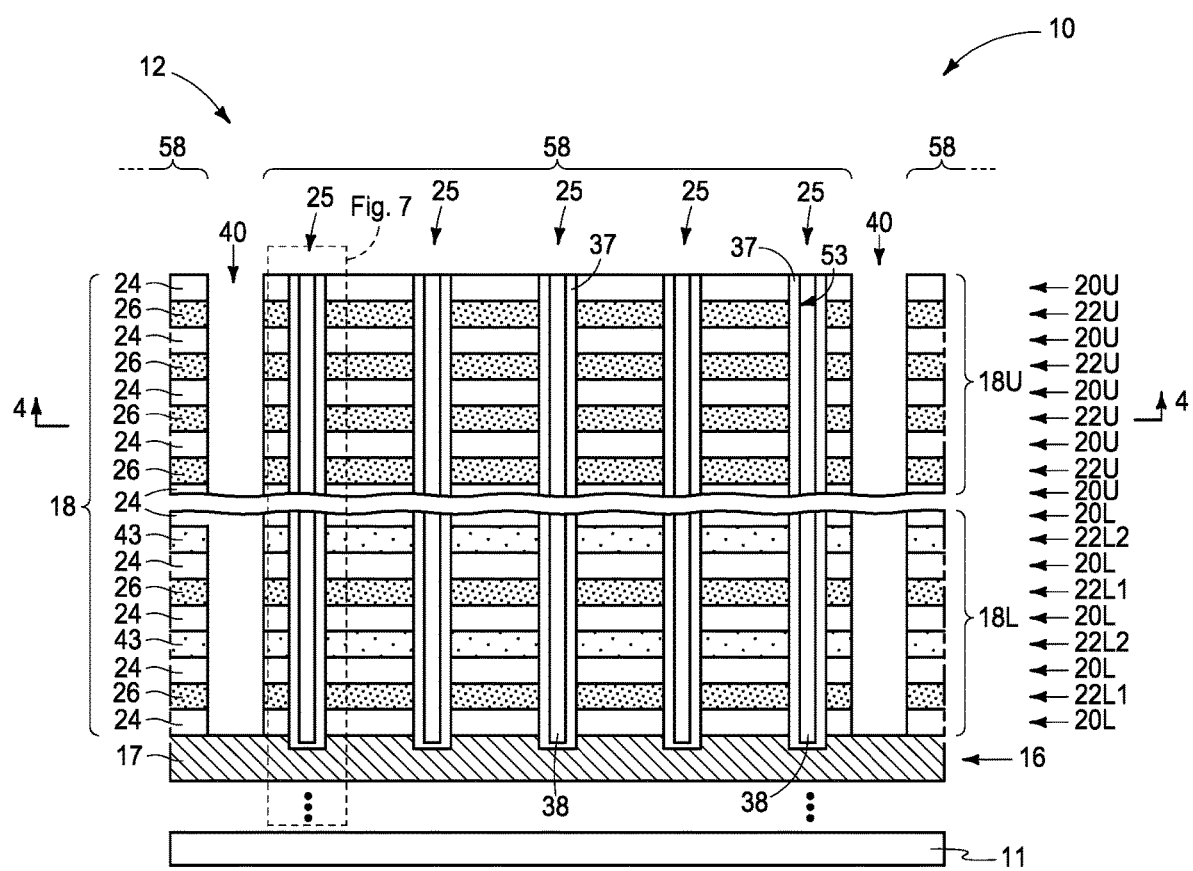
Figure 6:
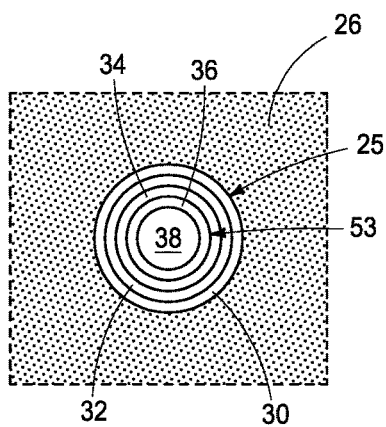
Figure 7:
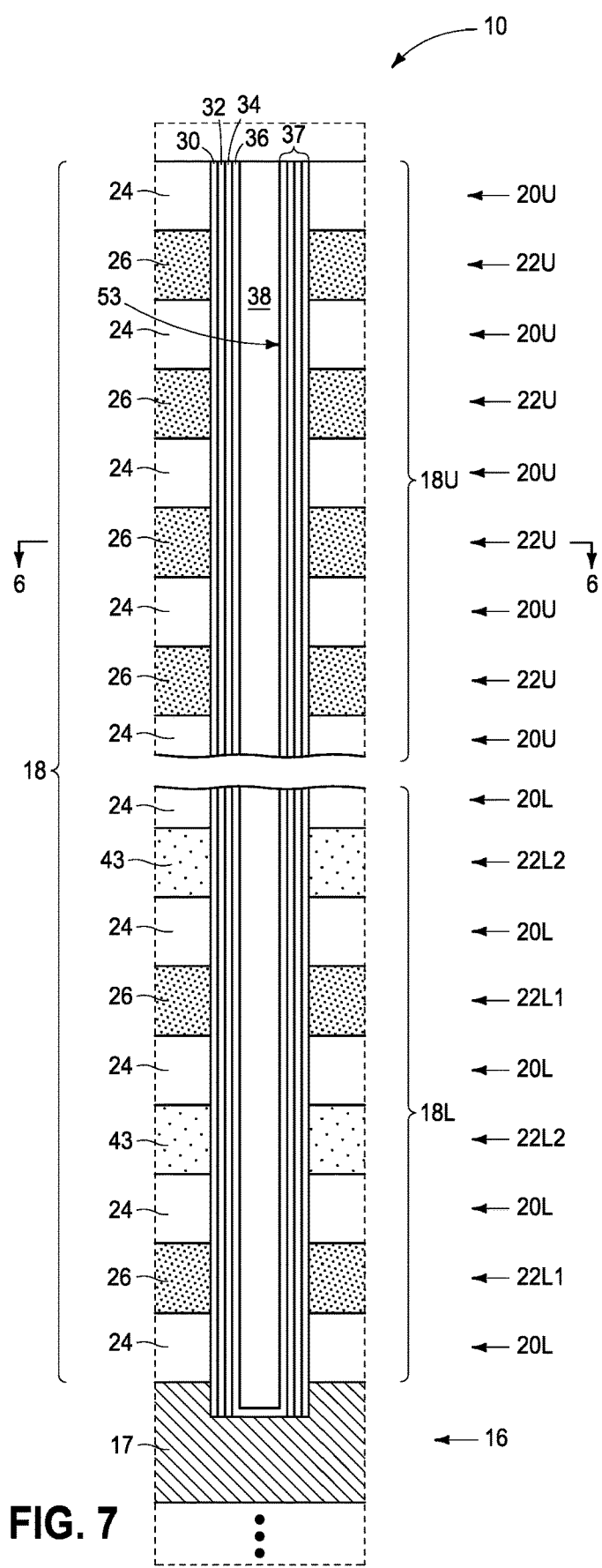
Figure 8:
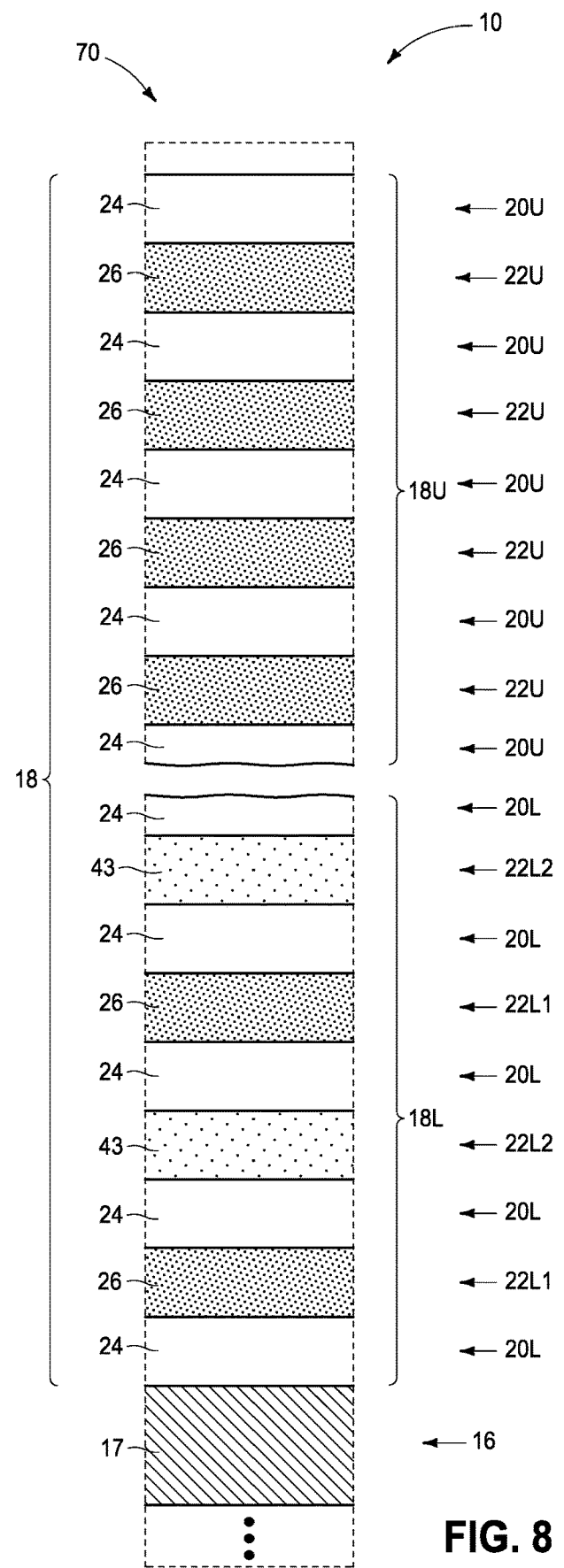

FIGS. 1-3 show an example construction 10 having an array 12 in which elevationally-extending strings of transistors and/or memory cells will be formed. Such includes a base substrate 11 having any one or more of conductive/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-3—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. By way of example, conductor material 17 may comprise an upper conductor material (e.g., n-type-doped or p-type-doped polysilicon) directly above and directly against a lower conductor material of different composition from upper conductor material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18/18* has been formed above substrate 11 and conductor tier 16 (an * being used as a suffix to be inclusive of all such same-numerically-designated components that may or may not have other suffixes). Stack 18* comprises vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing. Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate".

Lower portion 18L comprises multiple lower 22L* of conductive tiers 22* and multiple lower 20L of insulative tiers 20*. In one embodiment, lower insulative tiers 20L comprise insulative material 24 and lower conductive tiers 22L* comprise lower first-sacrificial-material tiers 22L1 (comprising first sacrificial material 26) and that vertically alternate with lower second-sacrificial-material tiers 22L2 (comprising second sacrificial material 43). First sacrificial material 26, second sacrificial material 43, and insulative material 24 are of different compositions relative one another. Relative to tiers 22L1 and 22L2, lower portion 18L is shown as starting with a tier 22L1 but could alternately start with a tier 22L2.

Vertically-alternating 22* conductive tiers and insulative tiers 20* of an upper portion 18U of stack 18* have been formed above lower portion 18L. Upper portion 18U comprises multiple upper 22U of conductive tiers 22* and multiple upper 20U of insulative tiers 20*. Upper conductive tiers 22U comprise first sacrificial material 26. Upper insulative tiers 20U comprise insulating material, for example insulating material 24, but may comprise other insulating material and the insulative material of insulative tiers 20L and the insulating material of insulative tiers 20U need not be of the same composition(s) relative one another. By way of examples only, example first and second sacrificial materials 26, 43 are one or more of silicon dioxide, silicon nitride, polysilicon, a silicon-germanium alloy, metal oxide, and metal material. By way of examples only, example insulative/insulating material 24 are one or more of silicon nitride, silicon dioxide, insulative metal oxide, and insulative polysilicon or an insulative silicon-germanium alloy (such polysilicon and/or alloy being sufficiently low-doped or undoped to not be semiconductive or conductive). In one embodiment, first sacrificial material 26 comprises silicon nitride and second sacrificial material 43 comprises polysilicon, and in one such embodiment insulative/insulating material 24 comprises silicon dioxide.

Example upper portion 18U is shown starting above lower portion 18L with an insulative tier 20U although such could alternately start with a conductive tier 22U (not shown). Regardless, only a small number of tiers 20* and 22* is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

In some embodiments, construction 10 may be considered as comprising a first region (e.g., as shown by FIGS. 1 and 2) and a second region 70 aside the first region (e.g., as shown in FIG. 3). Second region 70 may be laterally-contacting the first region (not shown) or may be laterally-spaced from the first region (e.g., closely laterally there-adjacent but not touching, or laterally-far there-from and not touching). Second region 70 may be within one or more of the memory block regions (not shown). In some embodiments, construction 10 may be considered as comprising a first vertical stack (e.g., stack 18* in FIG. 2) and a second vertical stack (e.g., stack 18* in second region 70), with the second stack comprising an upper portion 18U and a lower portion 18L.

Referring to FIGS. 4-8, channel openings 25 have been formed (e.g., by etching) through insulative tiers 20* and conductive tiers 22* in upper portion 18U into lower portion 18L and in one embodiment as shown to conductor tier 16 in lower portion 18L. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest conductive tier 22*. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 4-7 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (as shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not shown). Regardless, sacrificial etch-stop plugs (not shown) may be formed in lower portion 18L in horizontal locations where channel openings 25 will be prior to forming upper portion 18U. Channel openings 25 may then be formed by etching materials 24, 26, and 43 (likely using different anisotropic etching chemistries) to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Horizontally-elongated trenches 40 have been formed (e.g., by anisotropic etching) into stack 18* through upper portion 18U and into at least some of lower conductive tiers 22L1 and 22L2. Trenches 40 are individually between immediately-laterally-adjacent memory-block regions 58. Trenches 40 may taper laterally-inward in vertical cross-section moving deeper into stack 18* (not shown). By way of example and for brevity only, channel openings 25 are shown as being arranged in groups or columns of staggered rows of four and five channel openings 25 per row. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other or at the same time.

Trenches 40 as shown have been formed to extend to conductor tier 16. As one example, trenches 40 may be formed by etching materials 24, 26, and 43 (likely using different anisotropic etching chemistries) and that stops on or within conductor material 17. Alternately, and by way of example only, a sacrificial etch-stop line (not shown) having the same general horizontal outline as trenches 40 may individually be formed in or above conductor tier 16 before forming upper portion 18U. Trenches 40 may then be formed by etching materials 24, 26, and 43 to stop on or within the material of the individual sacrificial lines, followed by exhuming remaining material of such sacrificial lines. In one embodiment and as shown, the processing shown by FIGS. 4-7 (a first region) has not occurred in second region 70 in FIG. 8.

Ultimately, through horizontally-elongated trenches 40, one of the first and second sacrificial materials is replaced with conductive material and thereafter (i.e., not at the same time) the other of the first and second sacrificial materials is replaced with conducting material. Example methods of doing so are described with reference to FIGS. 9-26.

Figure 9:
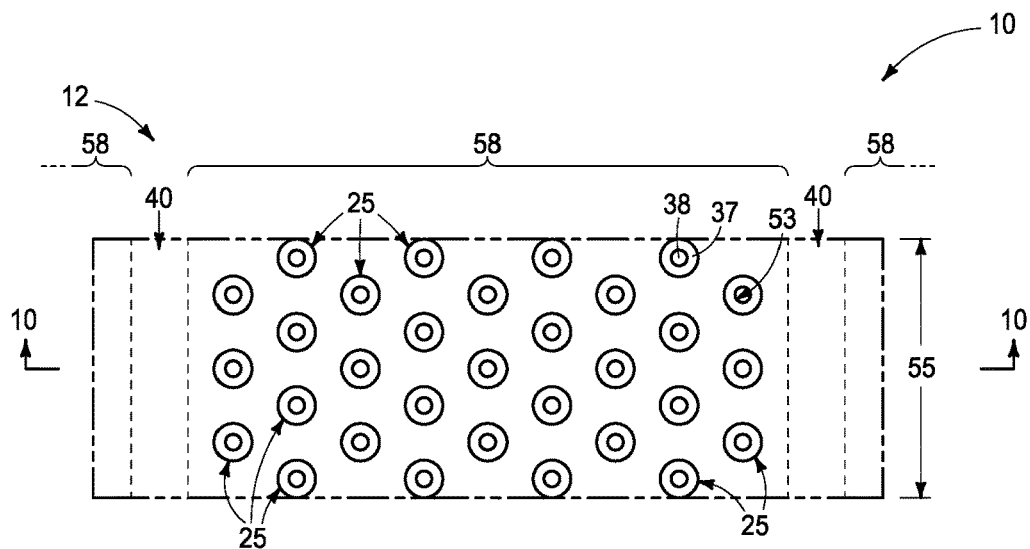
Figure 10:
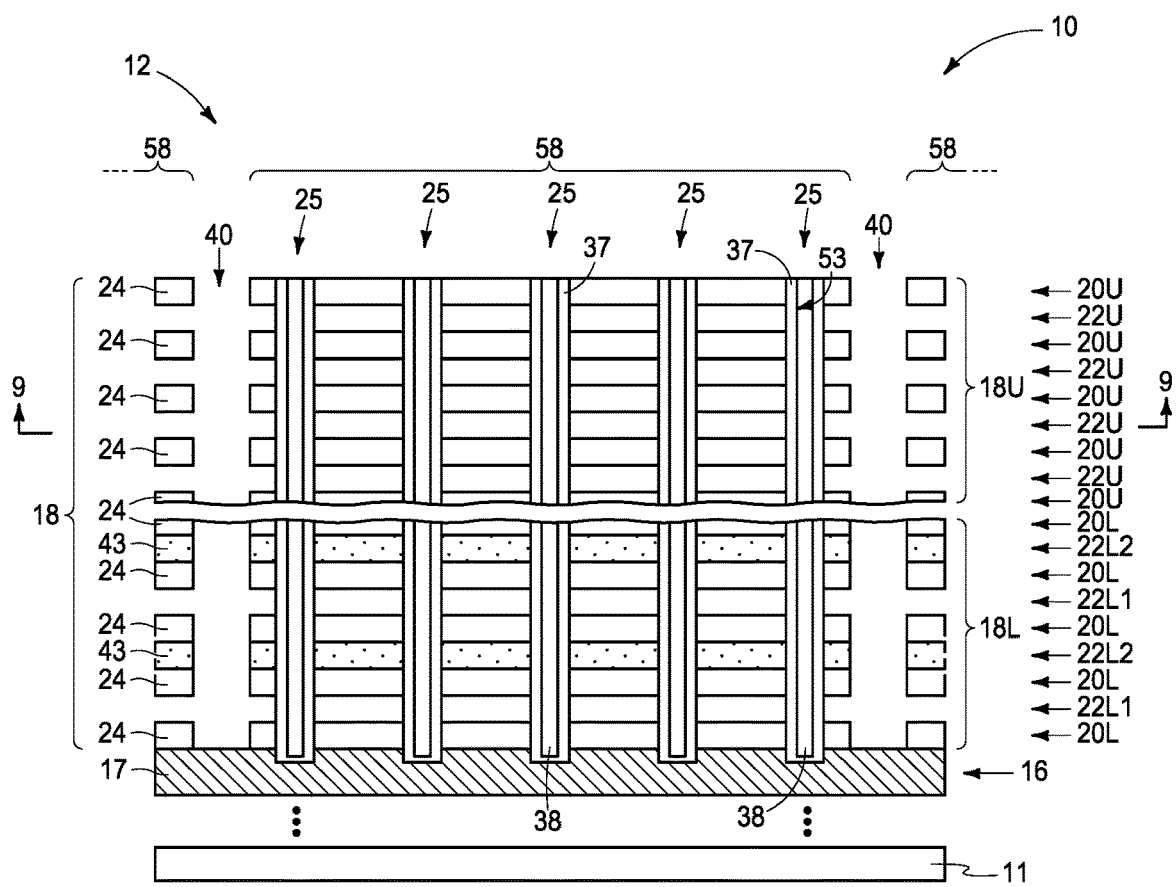
Figure 11:
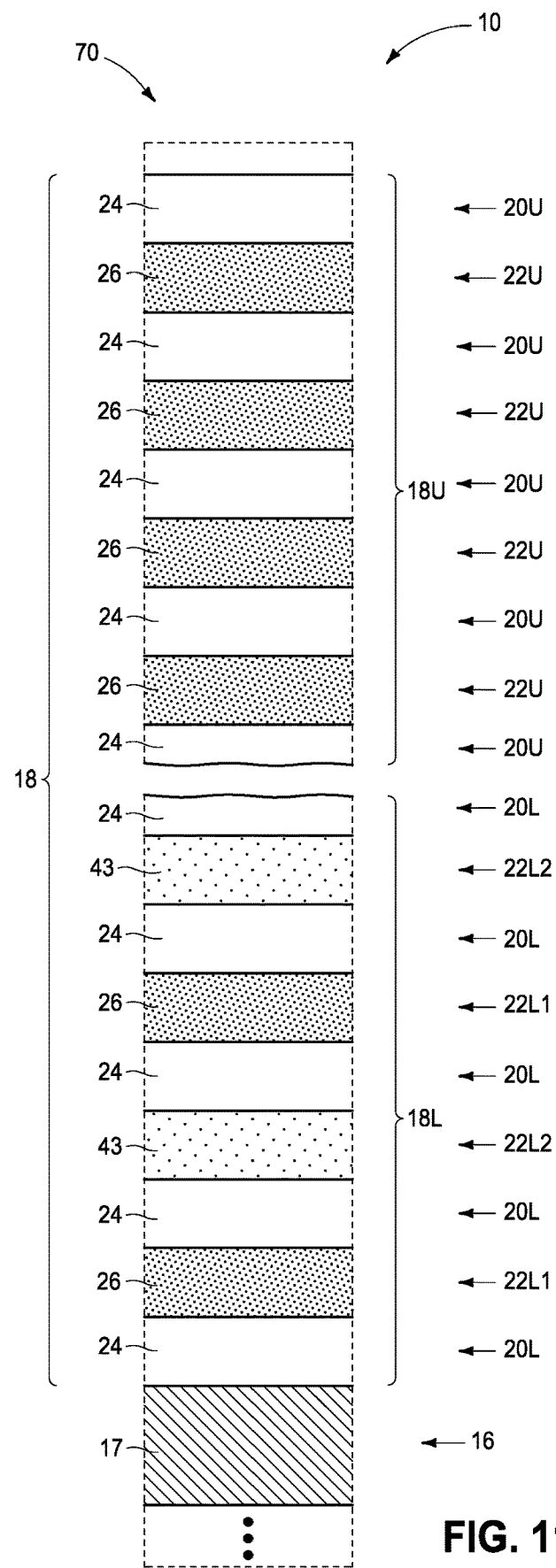

Referring to FIGS. 9-11, in one embodiment, through horizontally-elongated trenches 40, first sacrificial material 26 (not shown in FIGS. 9 and 10) has been isotropically etched selectively relative to second sacrificial material 43 and insulative material 24 (e.g., using liquid or vapor $H_3PO_4$ as a primary etchant where first sacrificial material 26 is silicon nitride, second sacrificial material 43 is polysilicon, and material 24 is silicon dioxide and/or an insulative metal oxide). In one embodiment and as shown, the processing shown by FIGS. 9 and 10 (a first region) has not occurred in second region 70 in FIG. 11.

Figure 12:
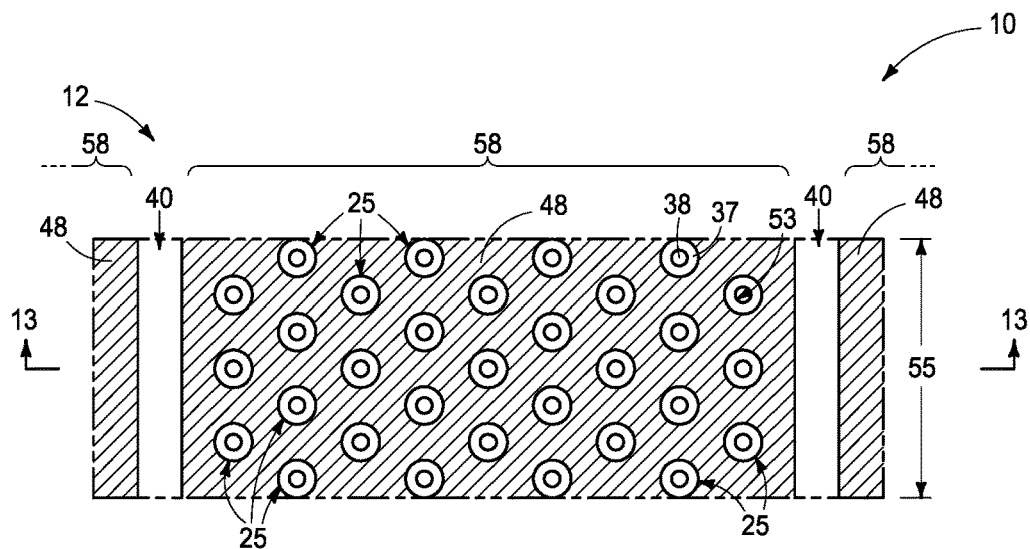
Figure 13:
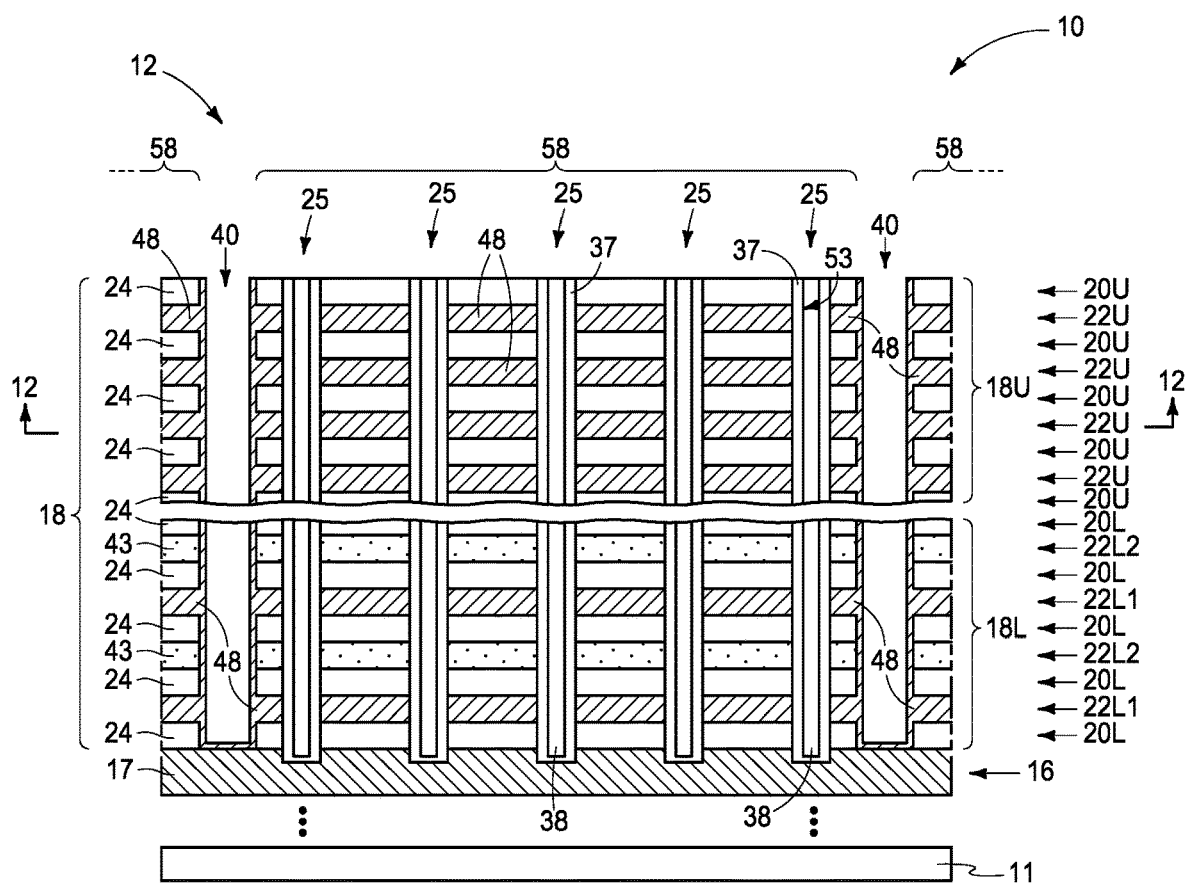
Figure 14:
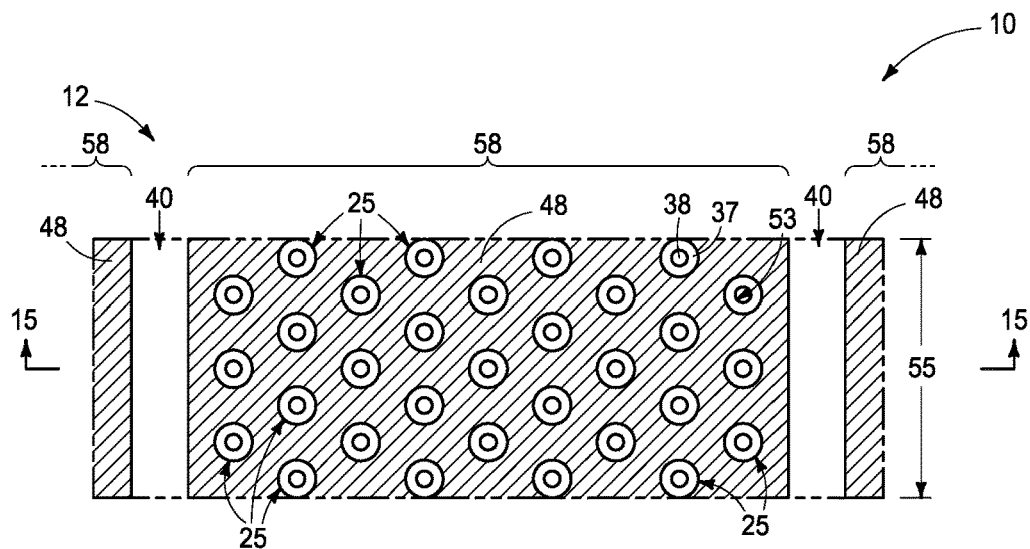
Figure 15:
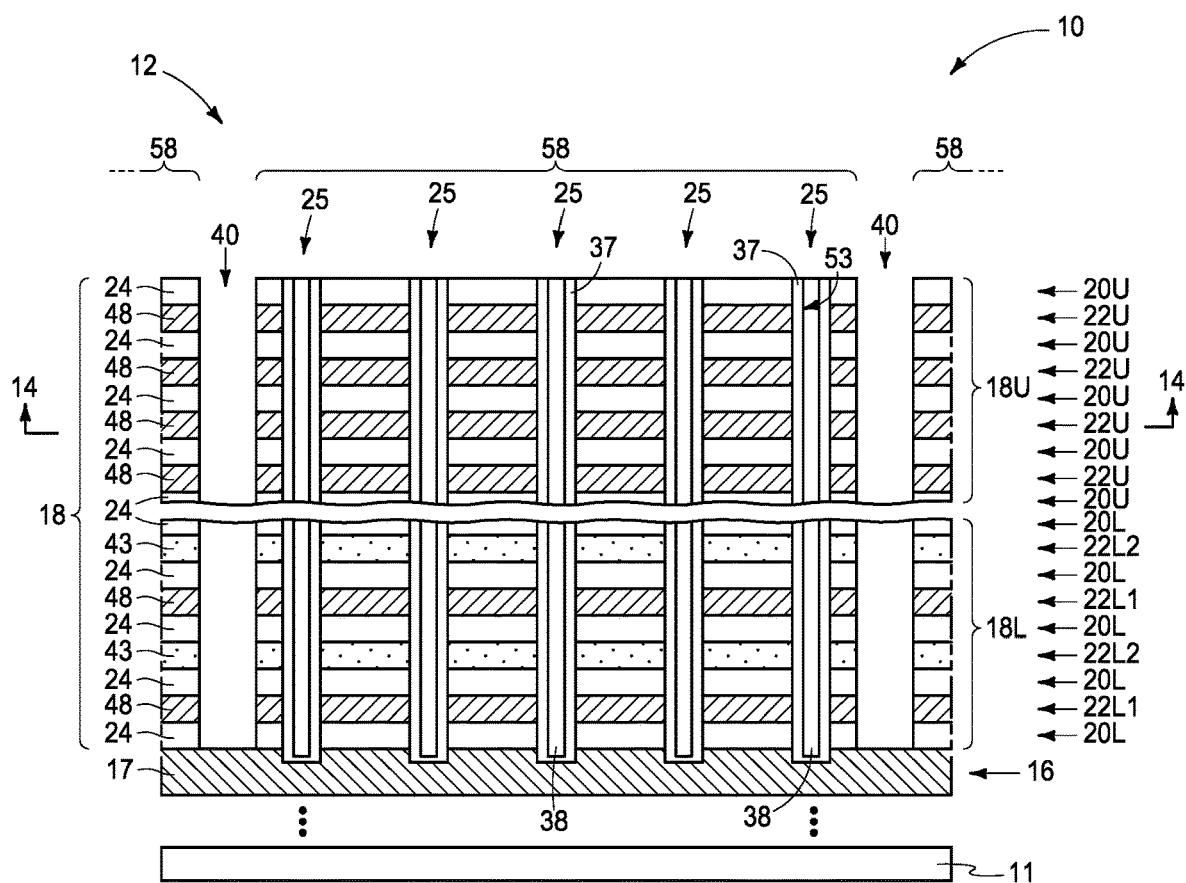
Figure 16:
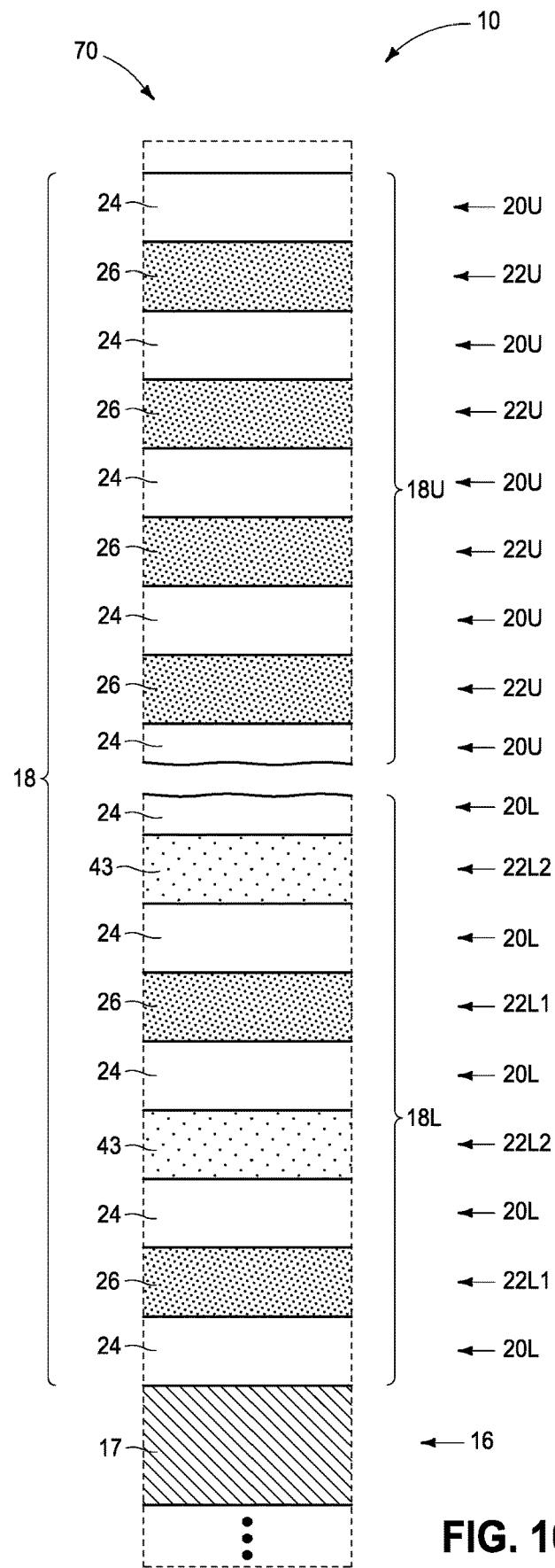

Referring to FIGS. 12 and 13, through horizontally-elongated trenches 40, first sacrificial material 26 (not shown and from FIGS. 4 and 5) has been replaced with conducting material 48 in conductive tiers 22U and 22L1. In one embodiment and as shown, conducting material 48 remains in horizontally-elongated trenches 40 after such replacing. In one such embodiment and as shown in FIGS. 14-16, at least a majority of conducting material 48 (i.e., more than 50% up to 100%; e.g., all/100% as shown) has been removed from horizontally-elongated trenches 40. In one embodiment and as shown, the processing shown by FIGS. 12-15 (a first region) has not occurred in second region 70 in FIG. 16.

Figure 17:
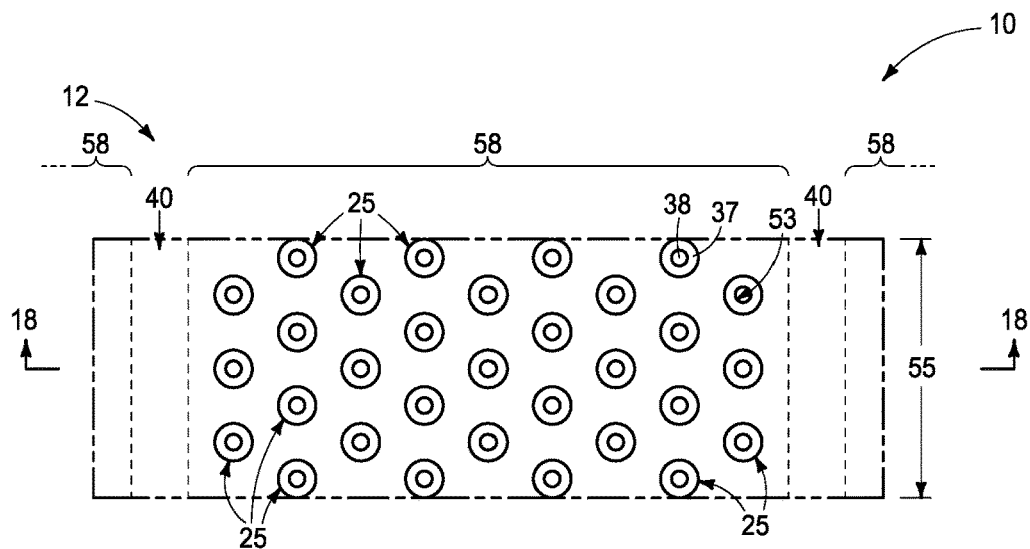
Figure 18:
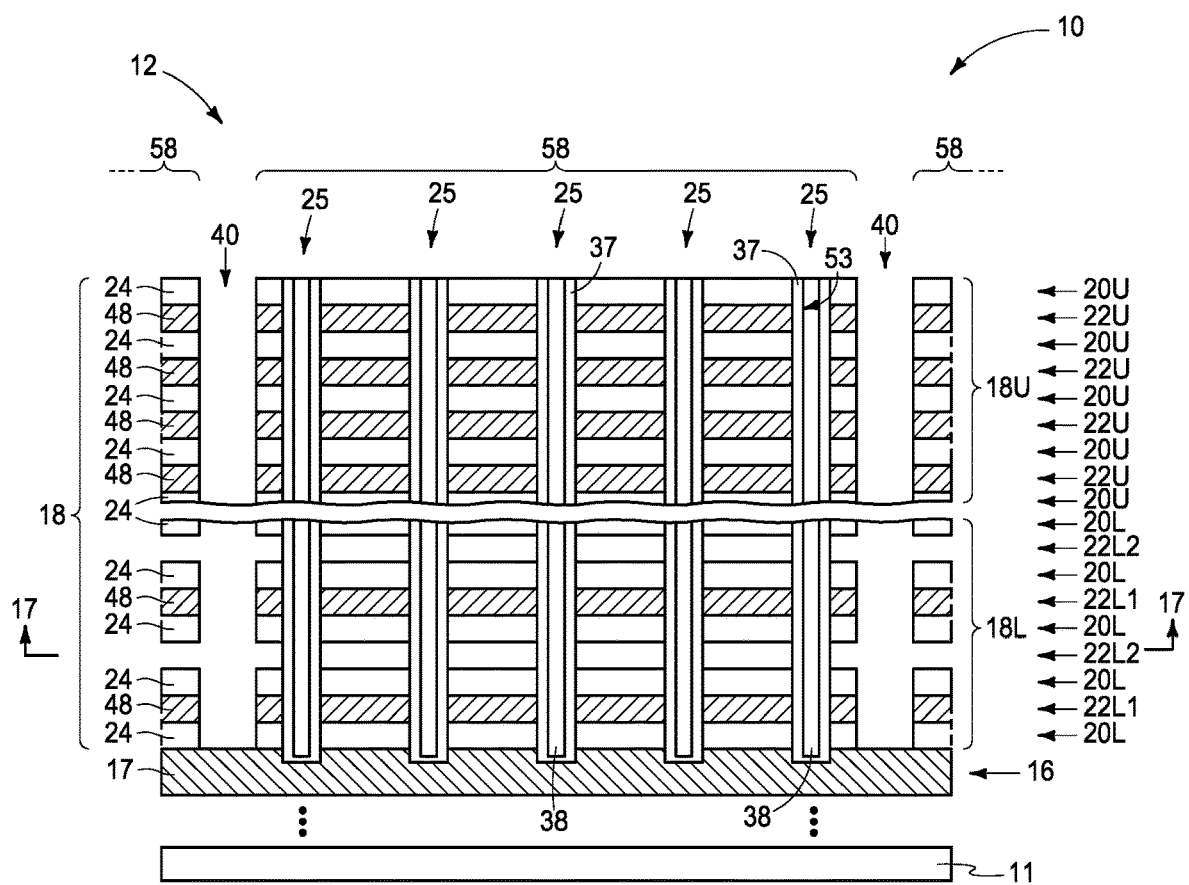
Figure 19:
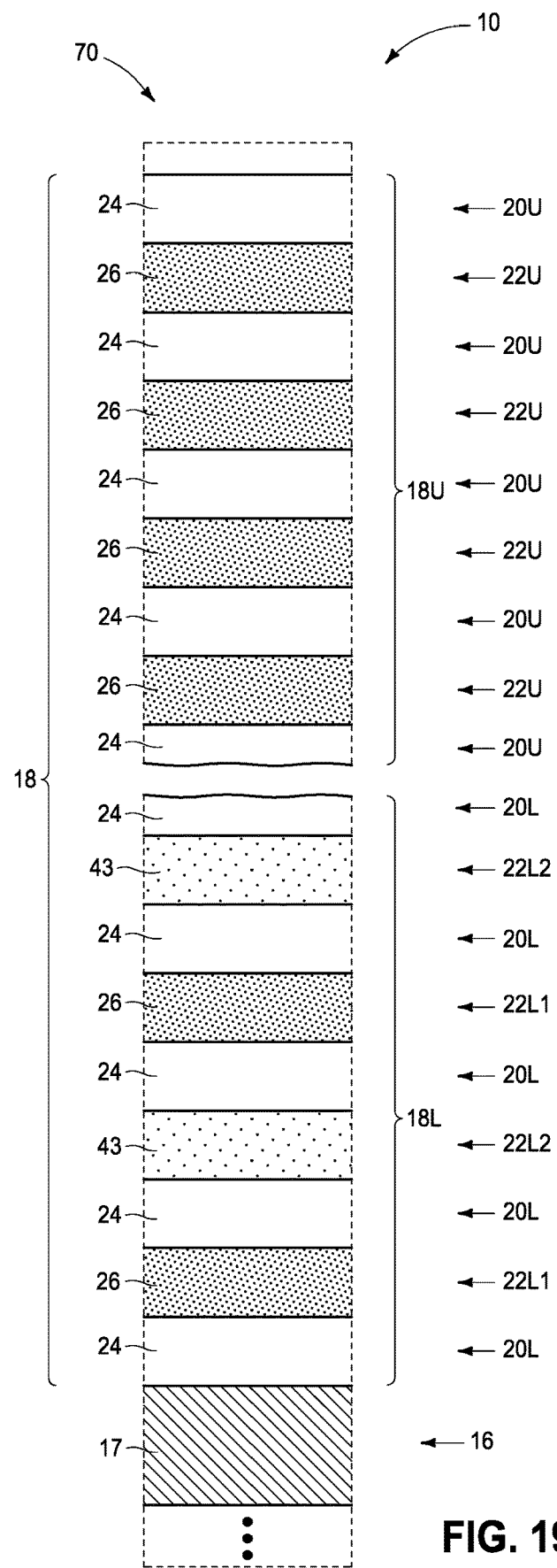

Referring to FIGS. 17-19, in one embodiment, through horizontally-elongated trenches 40, second sacrificial material 43 (not shown in FIGS. 17 and 18) has been isotropically etched selectively relative to insulative/insulating material 24 and conducting material 48 (resulting from replacing first sacrificial material 26 [not shown] therewith)(e.g., using liquid or vapor tetramethyl ammonium hydroxide as a primary etchant where second sacrificial material 43 is polysilicon, conducting material 48 is metal material [e.g., W], and material 24 is silicon dioxide and/or an insulative metal oxide). In one embodiment and as shown, the processing shown by FIGS. 17 and 18 (a first region) has not occurred in second region 70 in FIG. 19.

Figure 20:
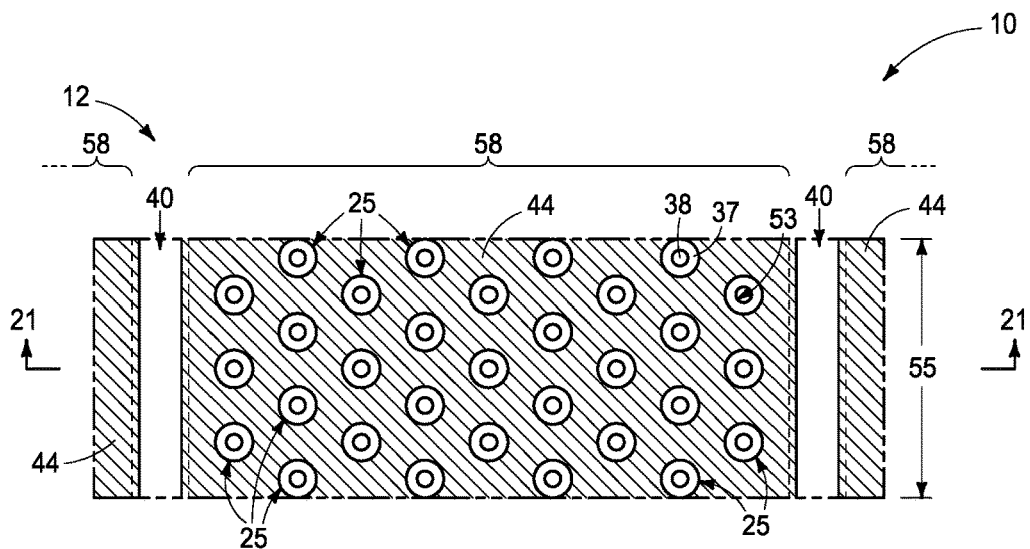
Figure 21:
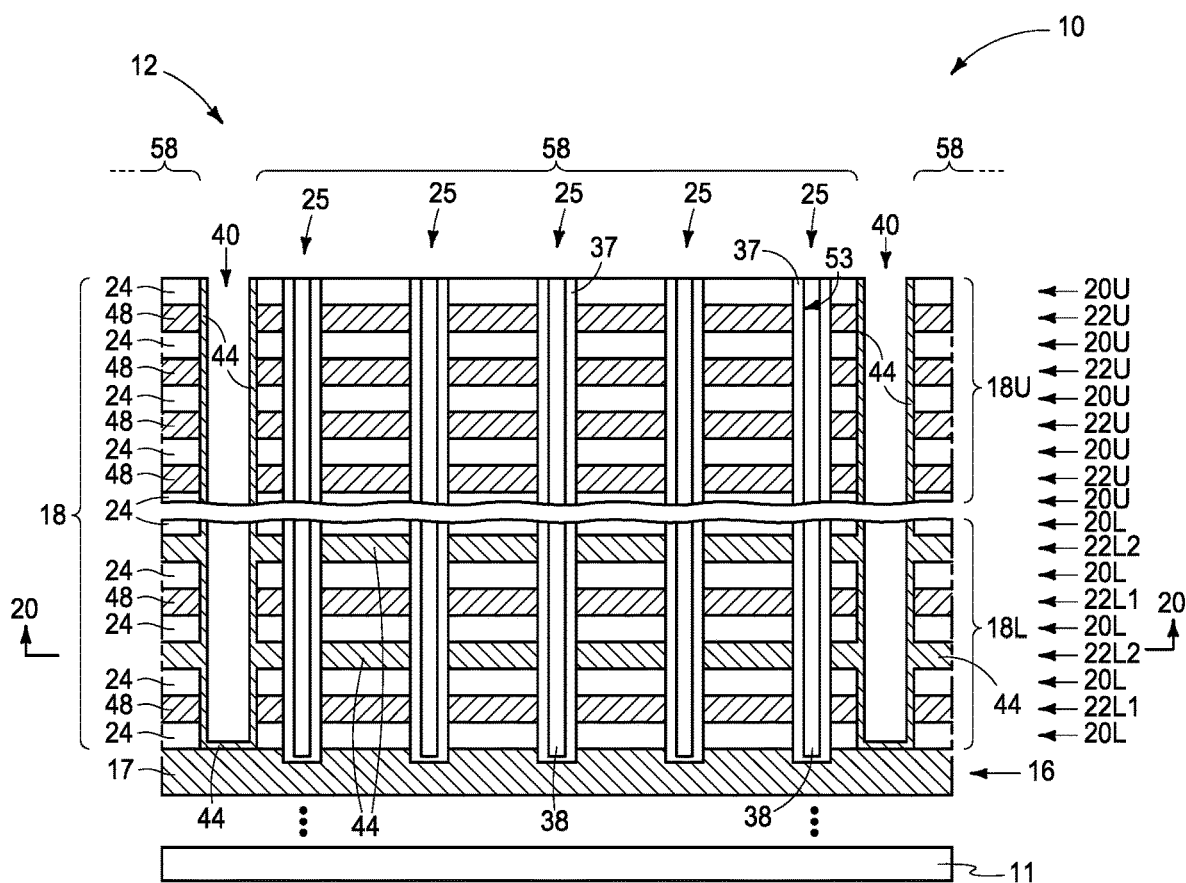
Figure 22:
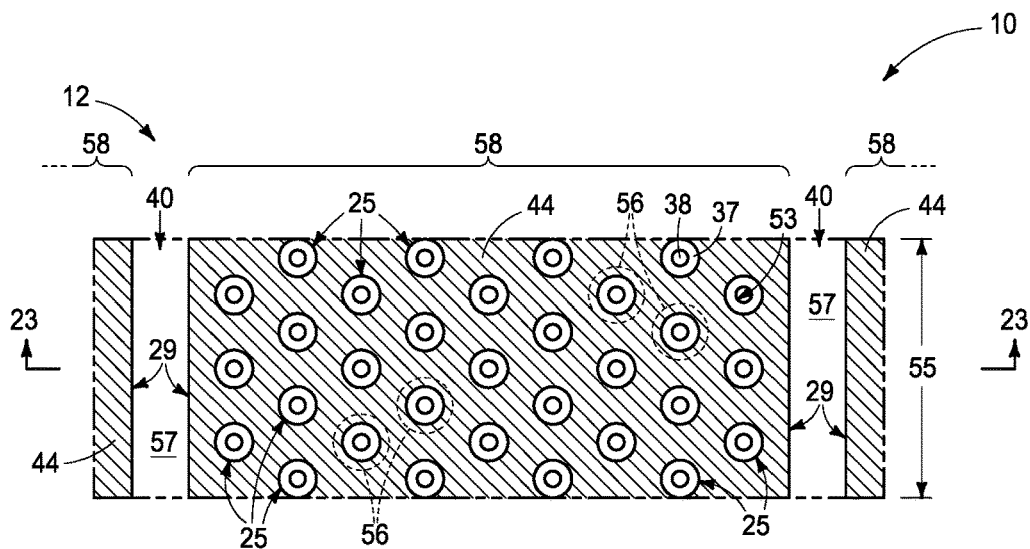
Figure 23:
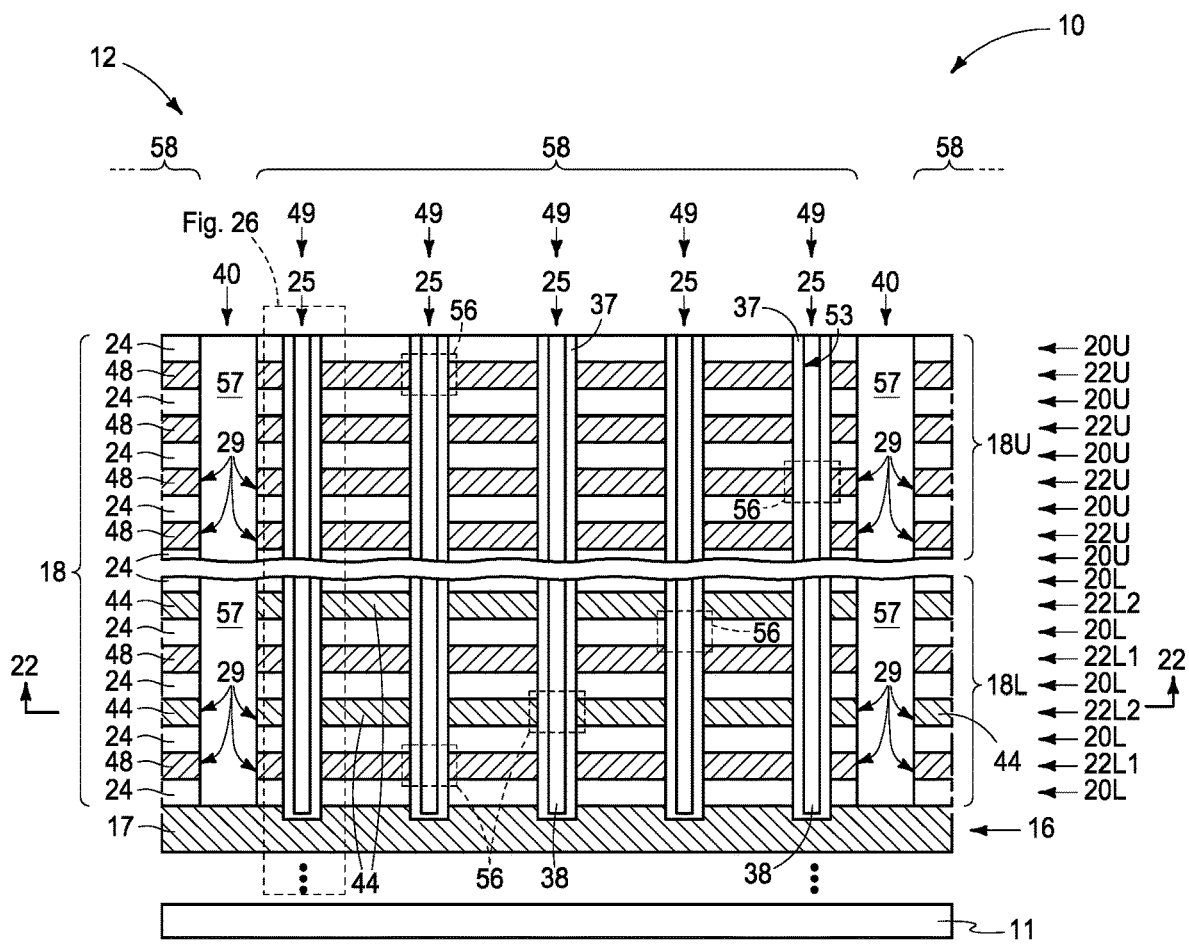
Figure 24:
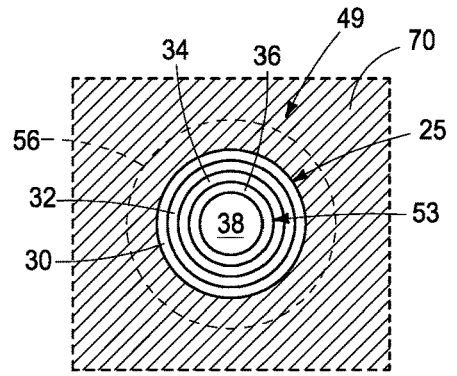
Figure 25:
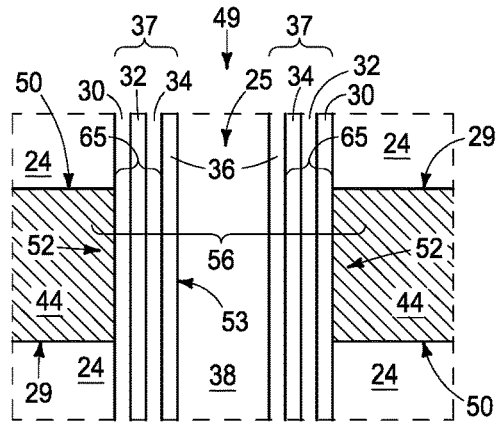
Figure 26:
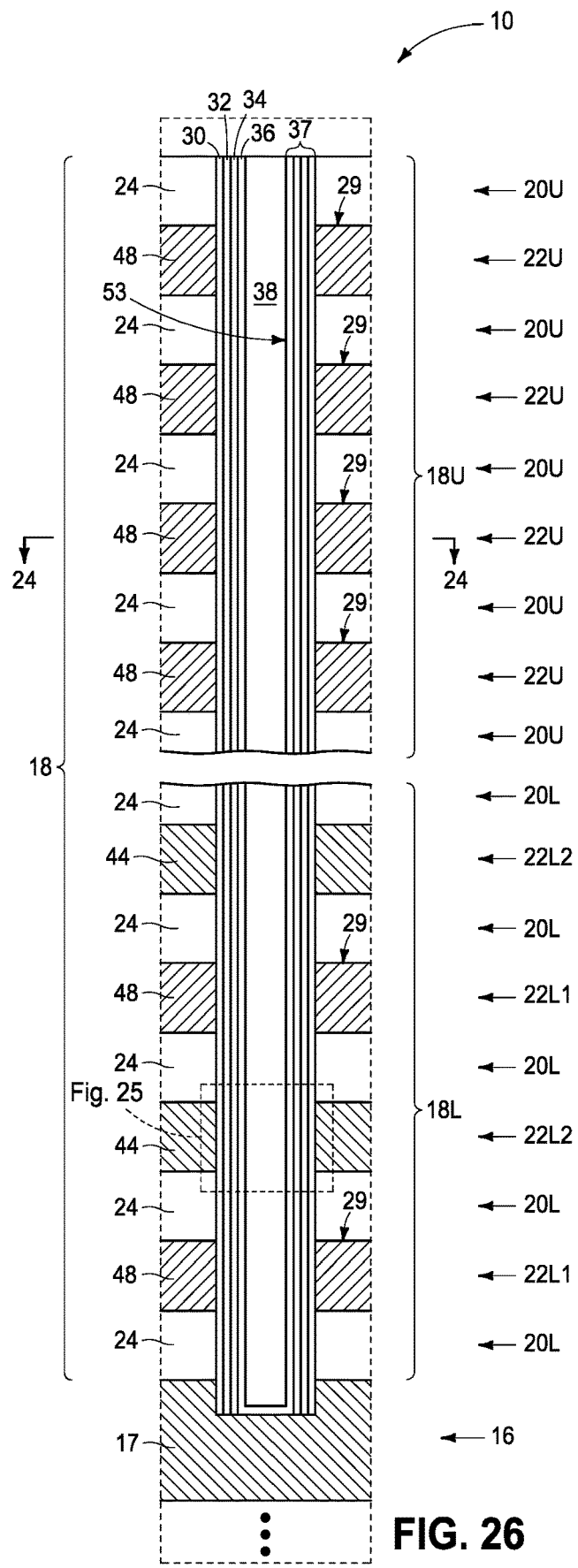
Figure 27:
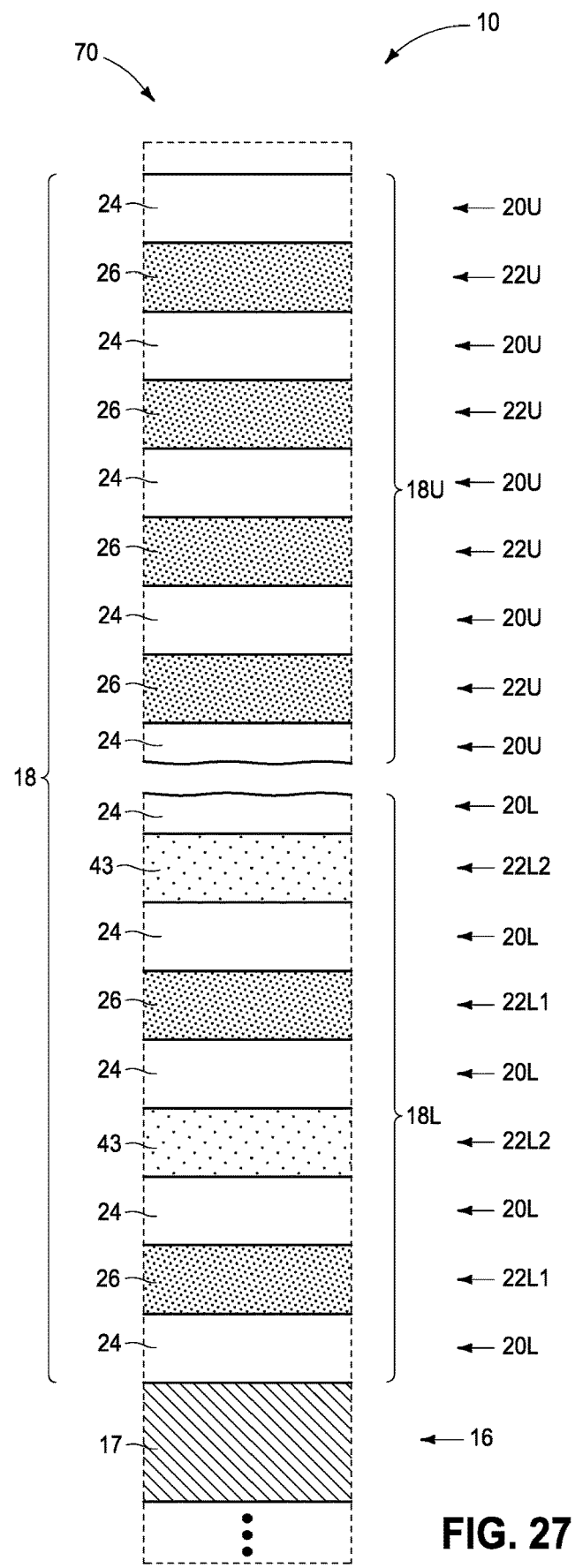

Referring to FIGS. 20 and 21, through horizontally-elongated trenches 40, second sacrificial material 43 (not shown and from FIG. 15) has been replaced with conductive material 44 in conductive tiers 22L2. In one embodiment and as shown, conductive material 44 remains in horizontally-elongated trenches 40 after such replacing. In one such embodiment and as shown in FIGS. 22-27, at least a majority of conductive material 44 (i.e., more than 50% up to 100%; e.g., all/100% as shown) has been removed from horizontally-elongated trenches 40. Conducting/conductive material 48/44 comprise individual conductive lines 29 (e.g., wordlines) and are part of elevationally-extending strings 49 of individual transistors and/or memory cells 56. Conducting material 48 and conductive material 44 may be of the same composition or of different compositions relative one another. A thin insulative liner (e.g., Al$_2$O$_3$ and not shown) may be formed before forming conducting material 48 and/or conductive material 44. In one embodiment and as shown, the processing shown by FIGS. 20-26 (a first region) has not occurred in second region 70 in FIG. 27.

Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material/conductive material 48/44 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25 and/or trenches 40. Alternately, the conducting/conductive material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22* from shorting relative one another in a finished circuitry construction. Example insulative materials are one or more of SiO$_2$, Si$_3$N$_4$, Al$_2$O$_3$, and undoped/low-doped polysilicon. Intervening material 57 may include through array vias (not shown).

Any other attribute(s) or aspect(s) as shown and/or described herein with respect to other embodiments may be used in the embodiments shown and described with reference to the above embodiments.

FIGS. 9-27 show an example wherein the replacing of the one of the first and second sacrificial materials with conductive material is with respect to first sacrificial material 26, followed by replacing the other of the first and second sacrificial materials (second sacrificial material 43) with conducting material. Such may be reversed, for example as shown in FIGS. 28-37 with respect to a construction 10a. Like numerals from the above-described embodiments have been used where appropriate, with some construction differences being indicated with the suffix "a" or with different numerals.

Figure 28:
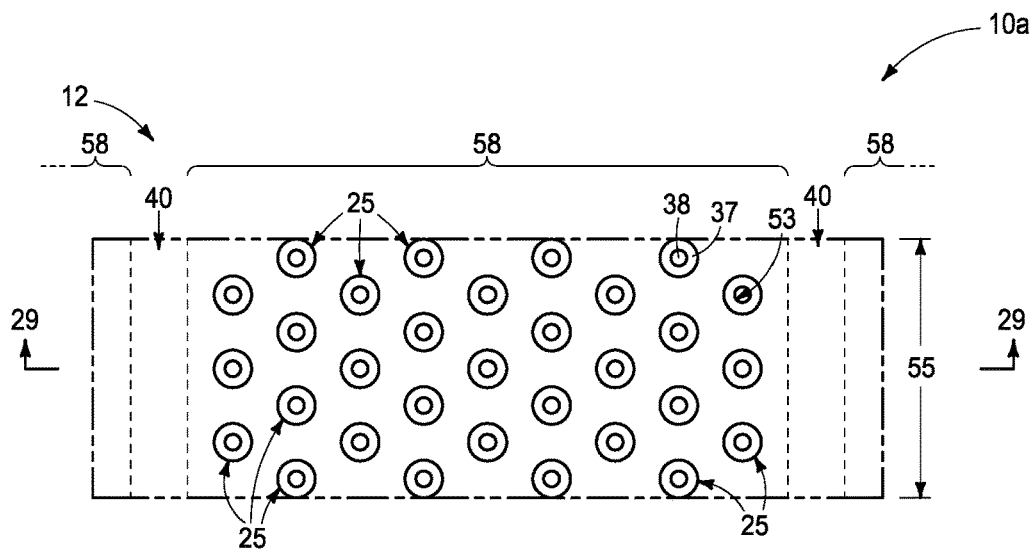
FIGS. 28-45 show alternate example method and/or structural embodiments of the invention.
Figure 29:
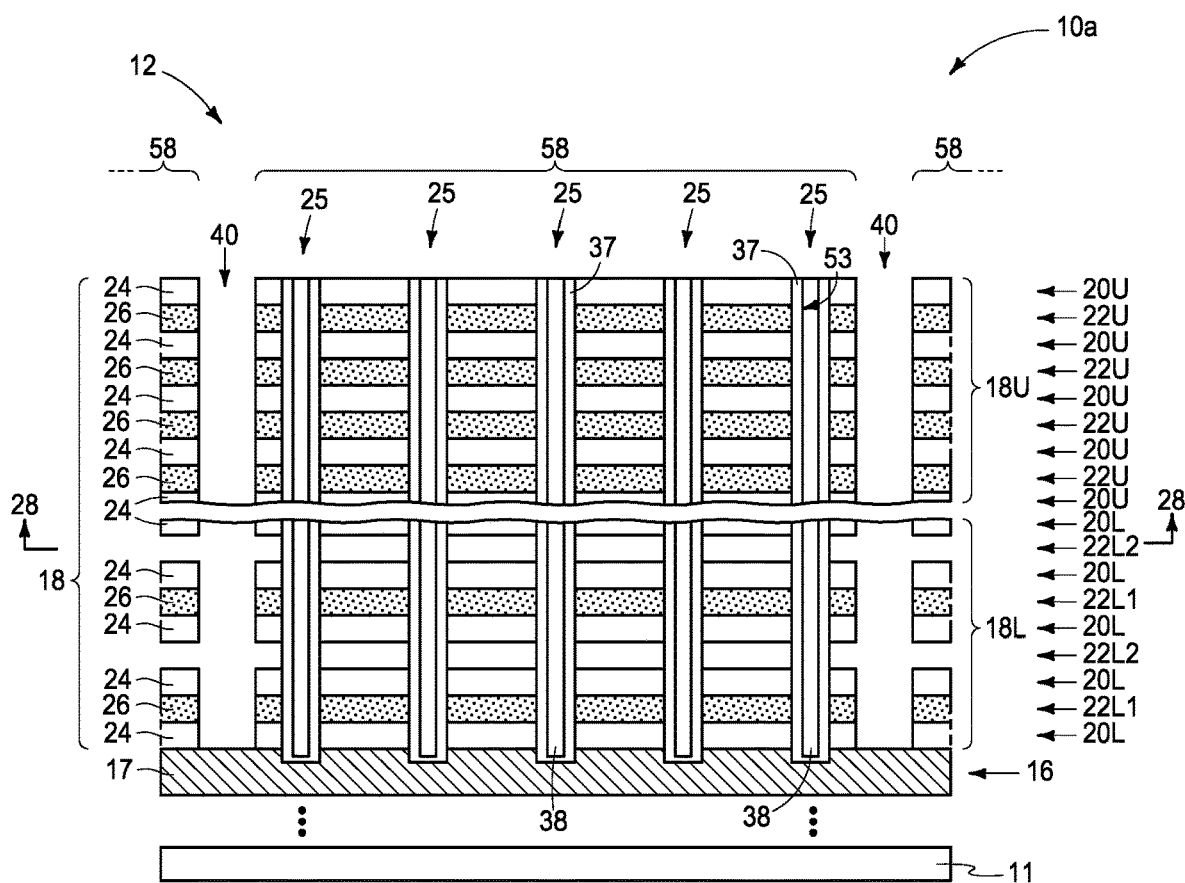
Figure 30:
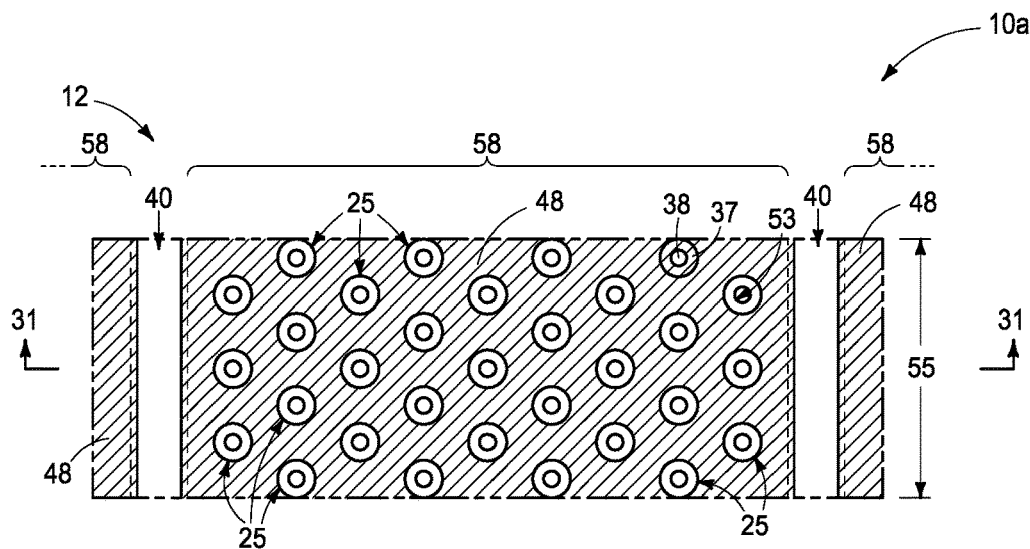
Figure 31:
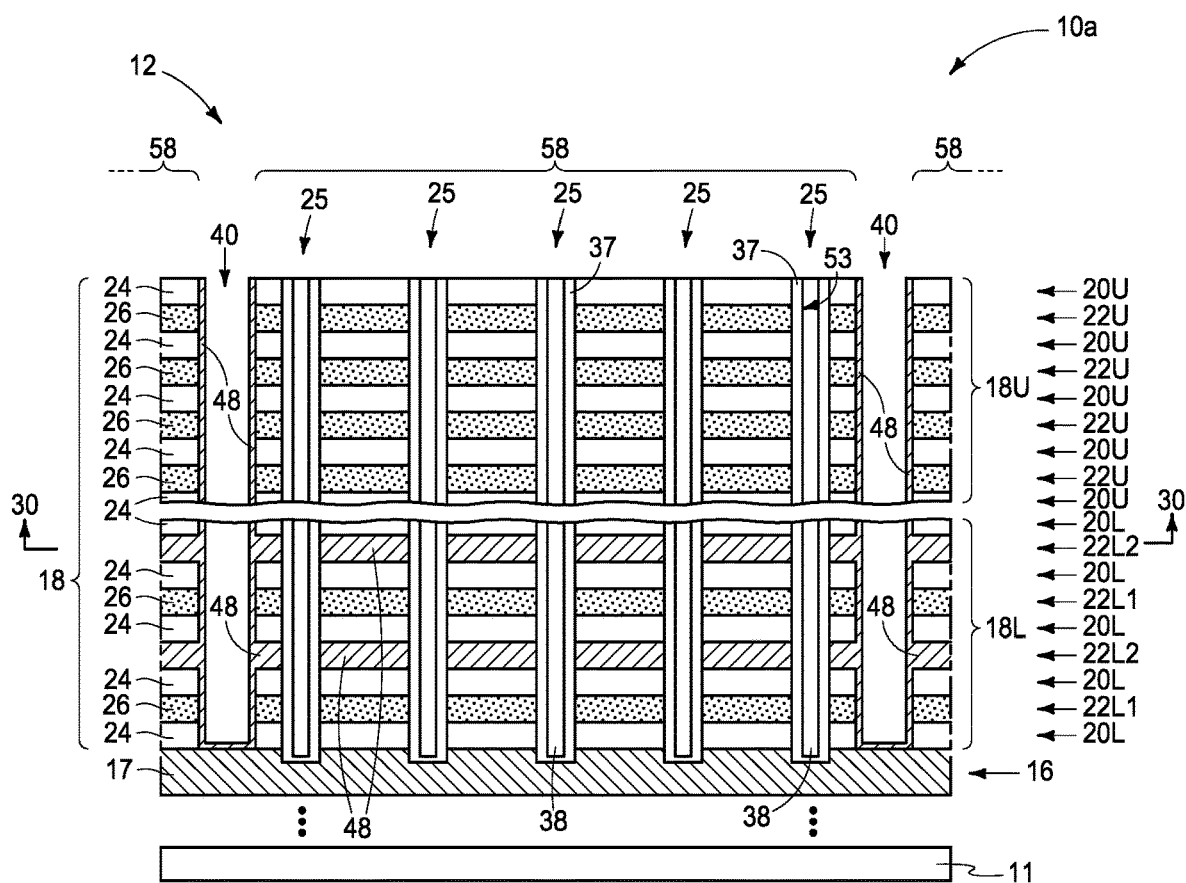
Figure 32:
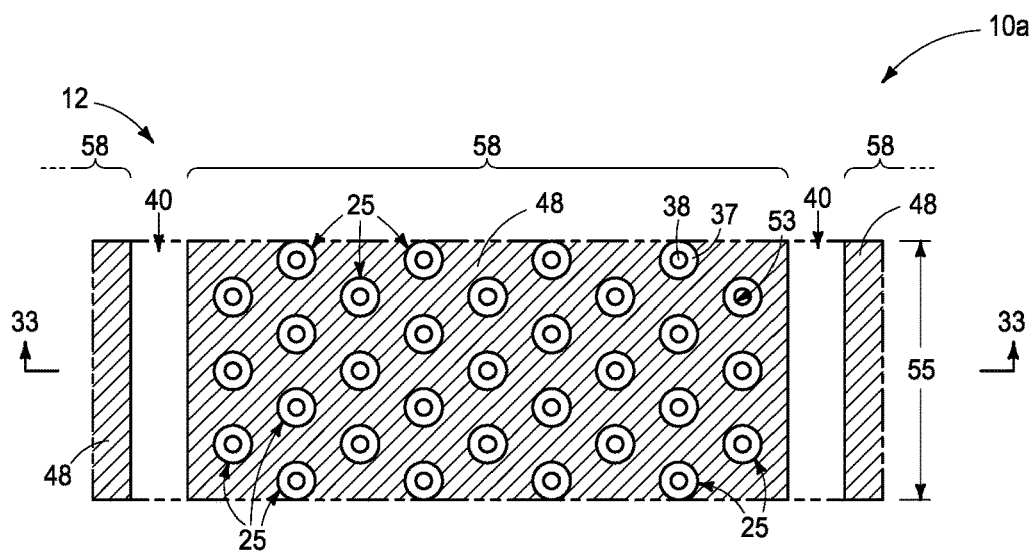
Figure 33:
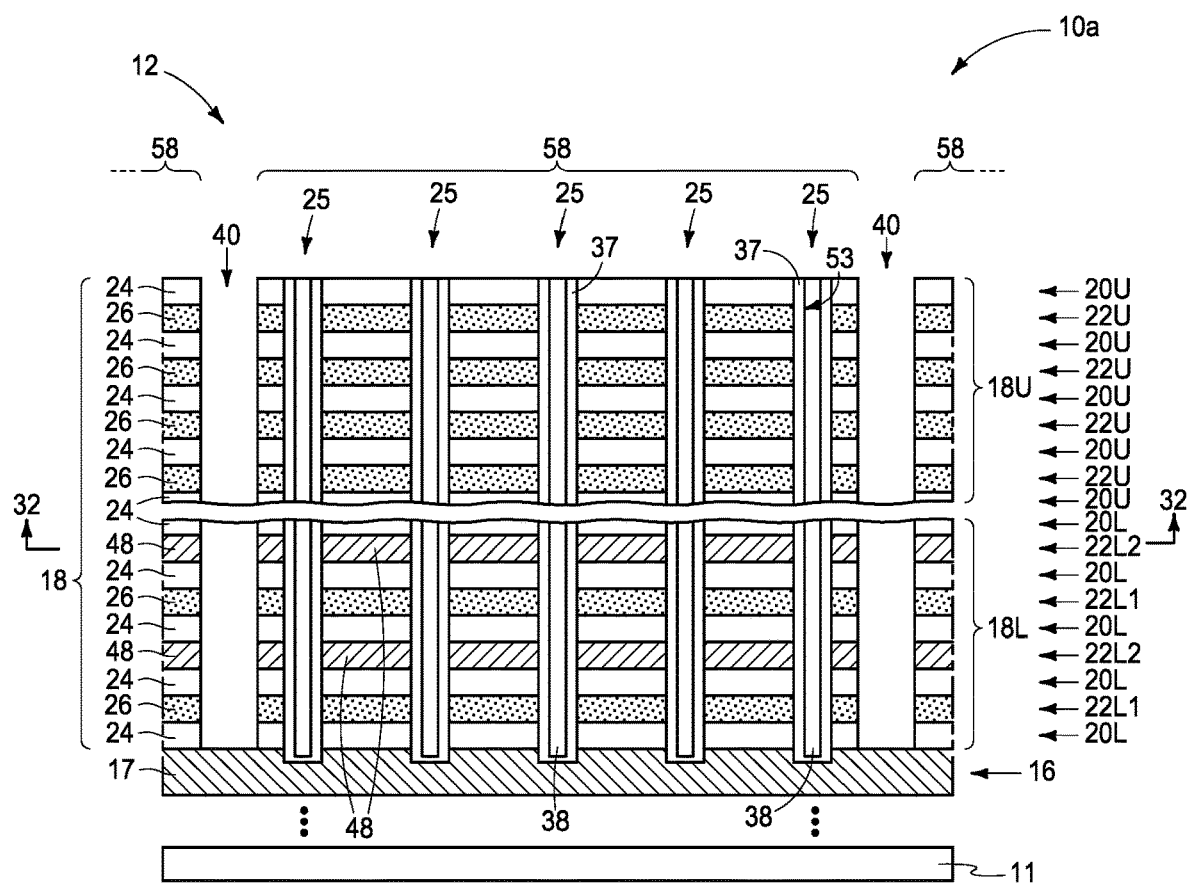
Figure 34:
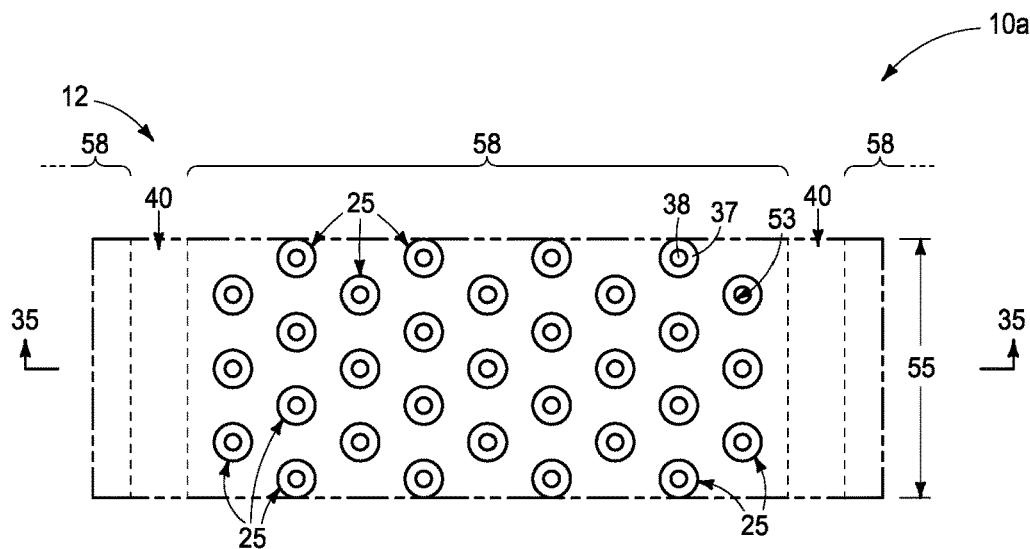
Figure 35:
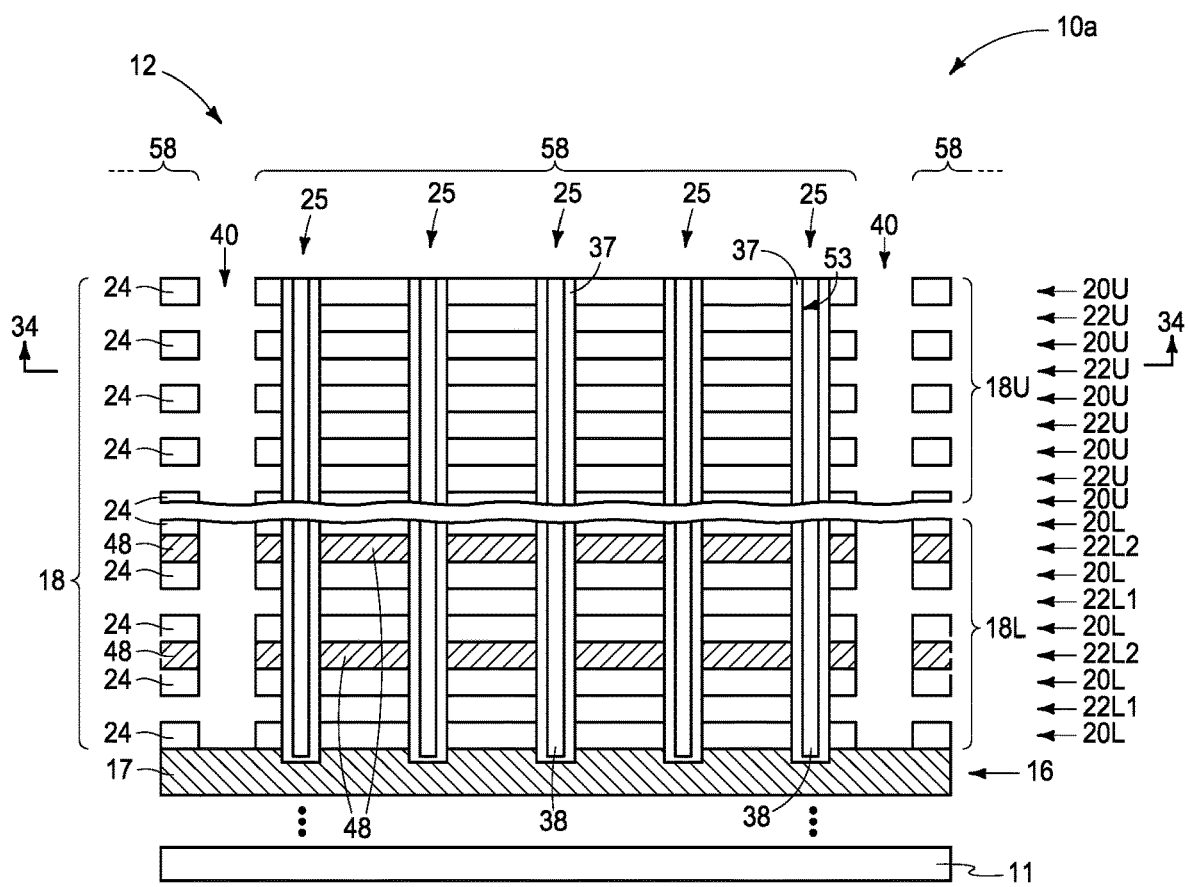
Figure 36:
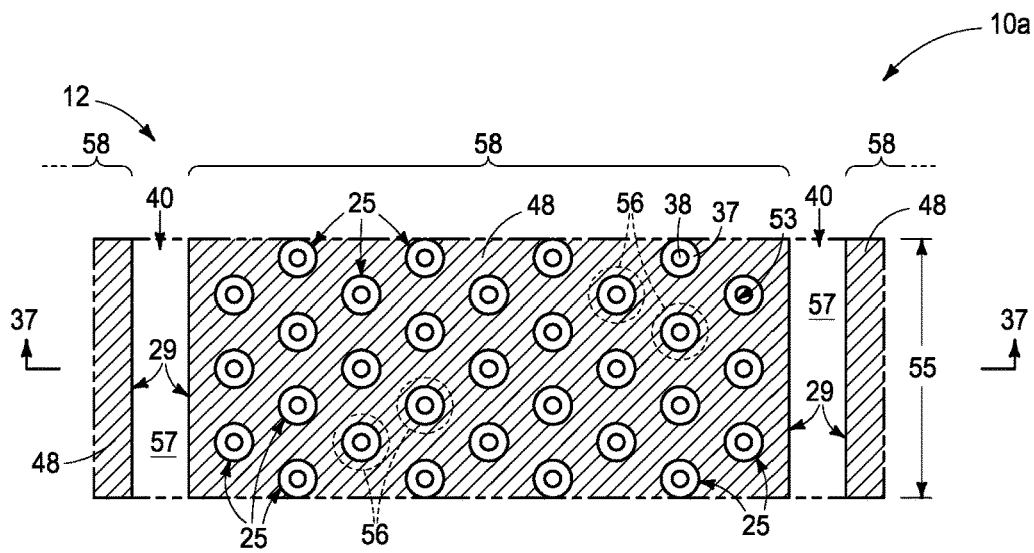
Figure 37:
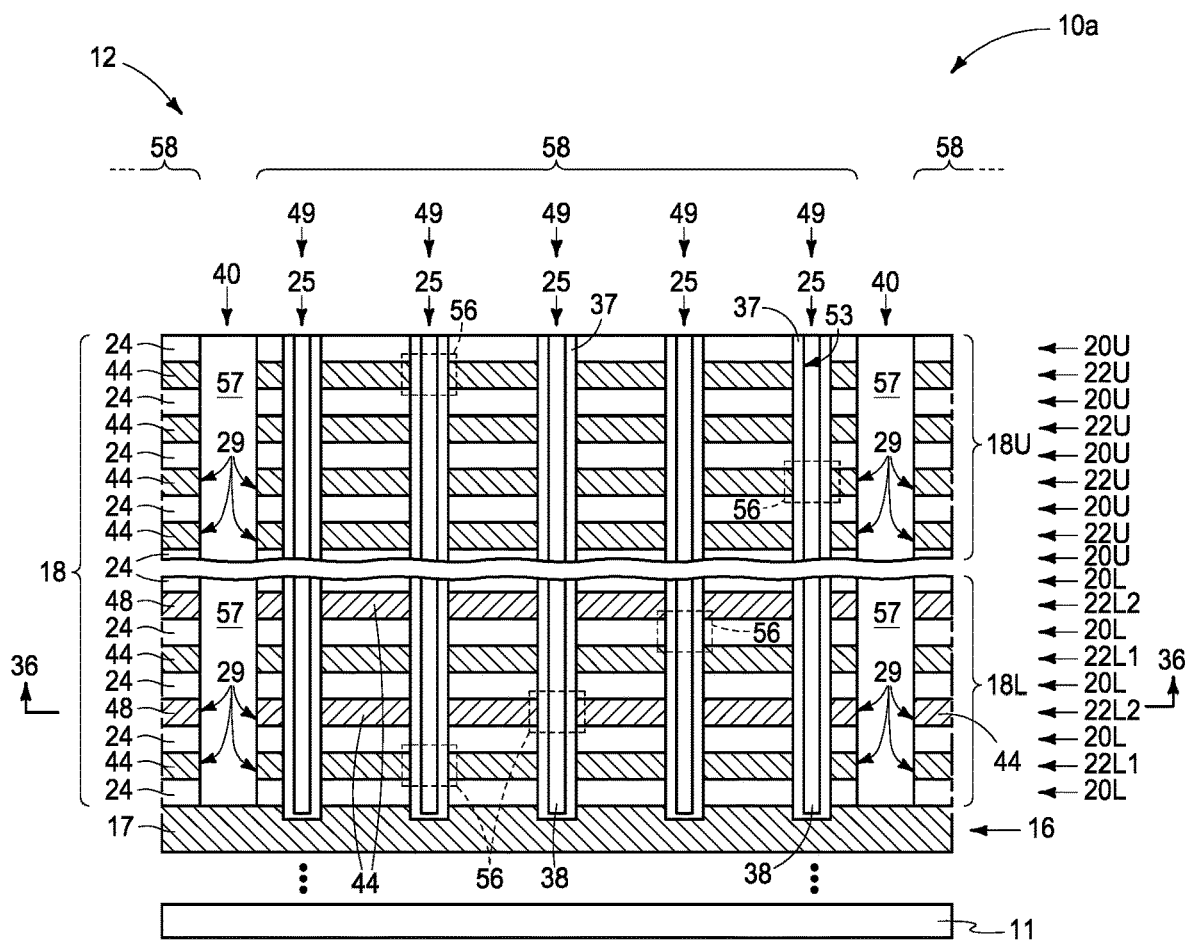

FIGS. 28 and 29 show analogous processing to that of FIGS. 9 and 10, but where second sacrificial material 43 (not shown) has been removed (e.g., by isotropic etching). FIGS. 30 and 31 show subsequent deposition of conducting material 48 (alternately, and by way of example, could have been conductive material 44 and not shown). FIGS. 32-37 show subsequent analogous processing to that shown and described above through and with respect to FIGS. 17, 18, 20-23, respectively. Any other attribute(s) or aspect(s) as shown and/or described herein with respect to other embodiments may be used.

An alternate example method used in forming a memory array comprising strings of memory cells is described with respect to FIGS. 38-45 and a construction 10b. Like numerals from the above-described embodiments have been used where appropriate, with some construction differences being indicated with the suffix "b" or with different numerals.

Figure 38:
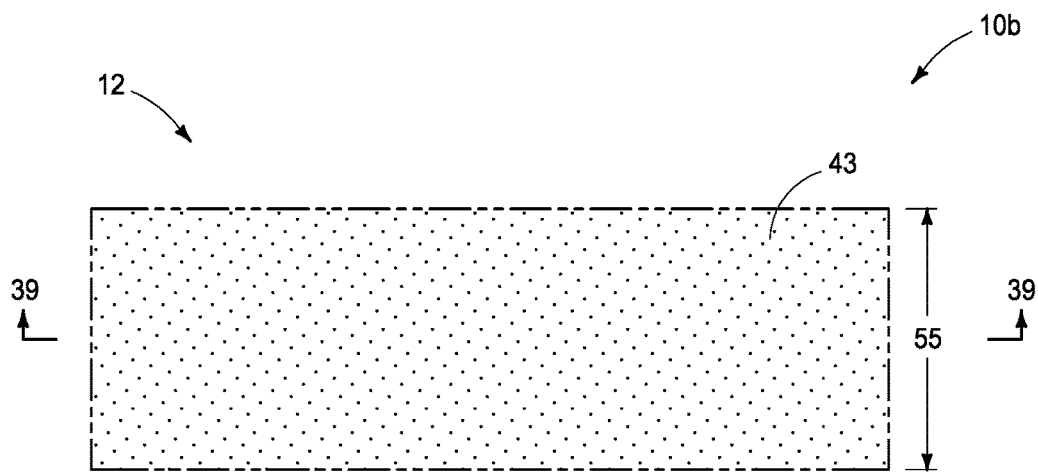
Figure 39:
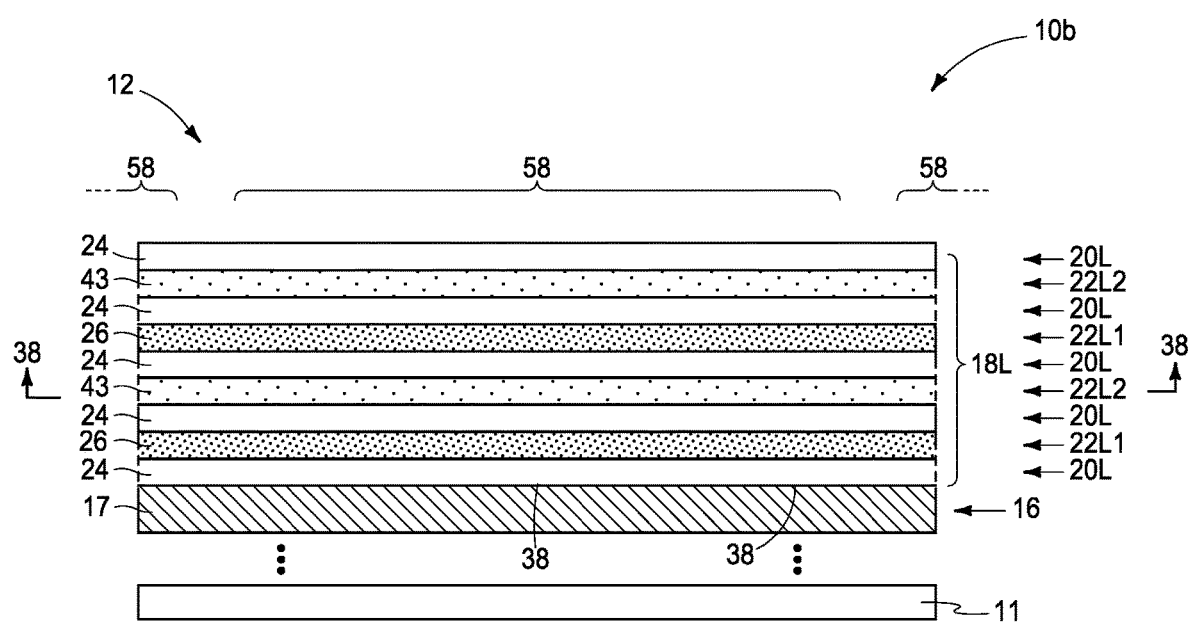

Referring to FIGS. 38 and 39, lower portion 18L of a stack 18* that will comprise vertically-alternating conductive tiers 22* and insulative tiers 20* has been formed. Stack 18* comprises laterally-spaced memory block regions 58. Lower portion 18L comprises multiple lower 22L* of conductive tiers 22* and multiple lower 20L of insulative tiers 20*. Lower insulative tiers 20L comprise insulative material 24. Lower conductive tiers 22L* comprise sacrificial material 43 (in other embodiments referred to as second sacrificial material 43) that is of different composition from that of insulative material 24. In one embodiment and as shown (not required), lower conductive tiers 22L* comprise lower sacrificial-material tiers 22L2 (in other embodiments referred to as second-sacrificial-material tiers 22L2) that vertically alternate with lower sacrifice-material tiers 22L1 (e.g., comprising sacrifice material 26 and in other embodiments referred to as first sacrificial material 26).

Figure 40:
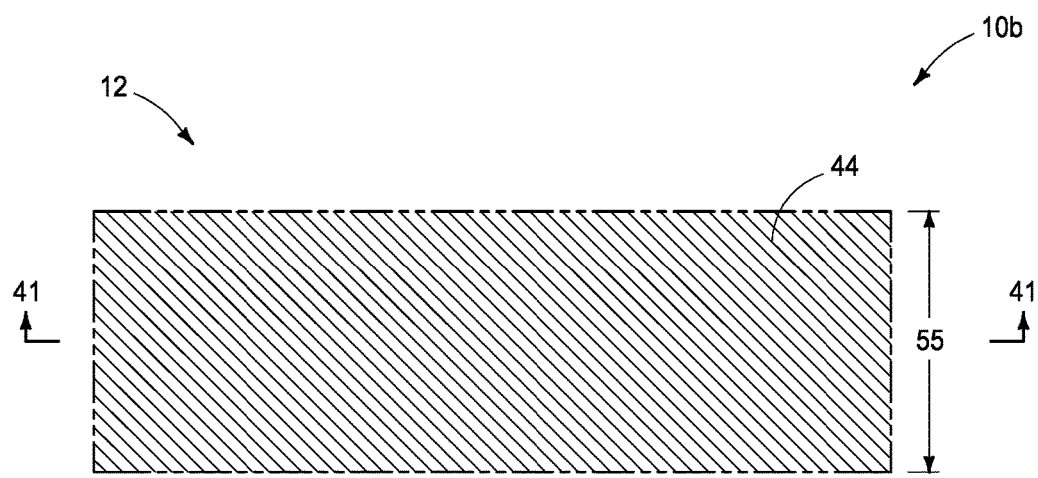
Figure 41:
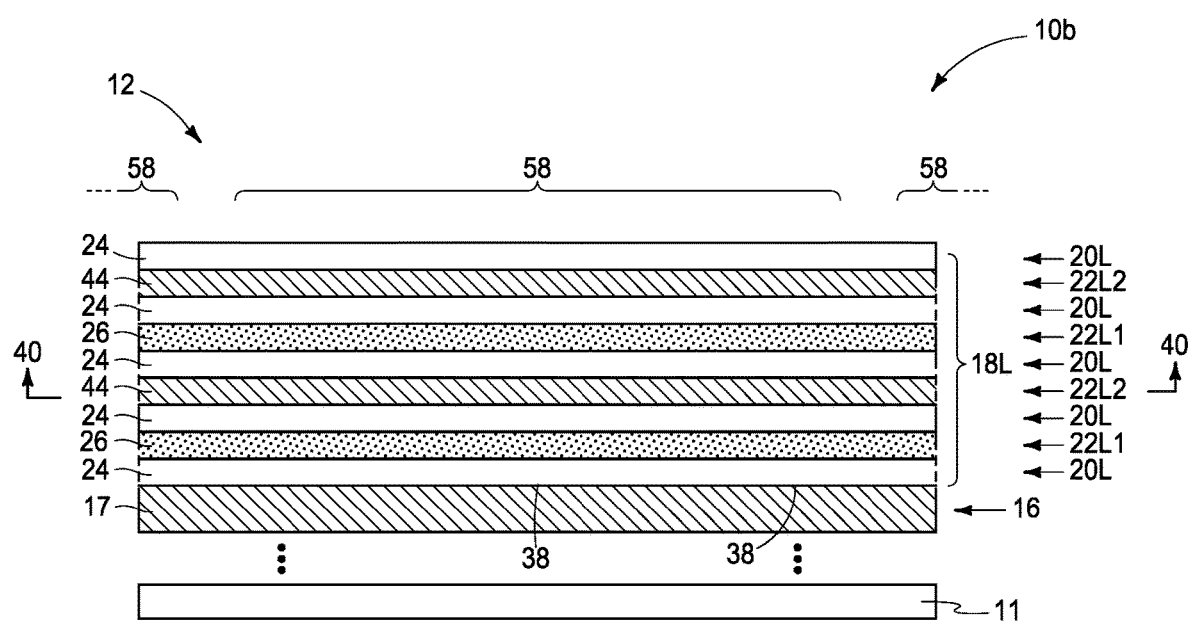

Referring to FIGS. 40 and 41, sacrificial material 43 (not shown) has been replaced with conductive material 44 (alternately, and by way of example, could have been with conducting material 48 and not shown). Such may occur, for example, by any of the methods described above. Alternately, material 26 may be considered as the sacrificial material and be replaced with conductive/conducting material (not shown).

Figure 42:
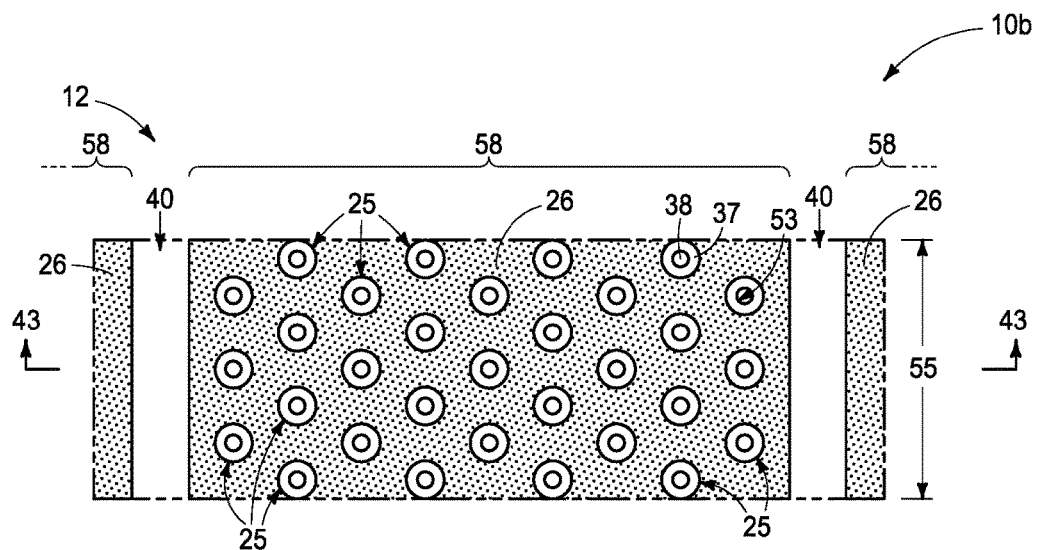
Figure 43:
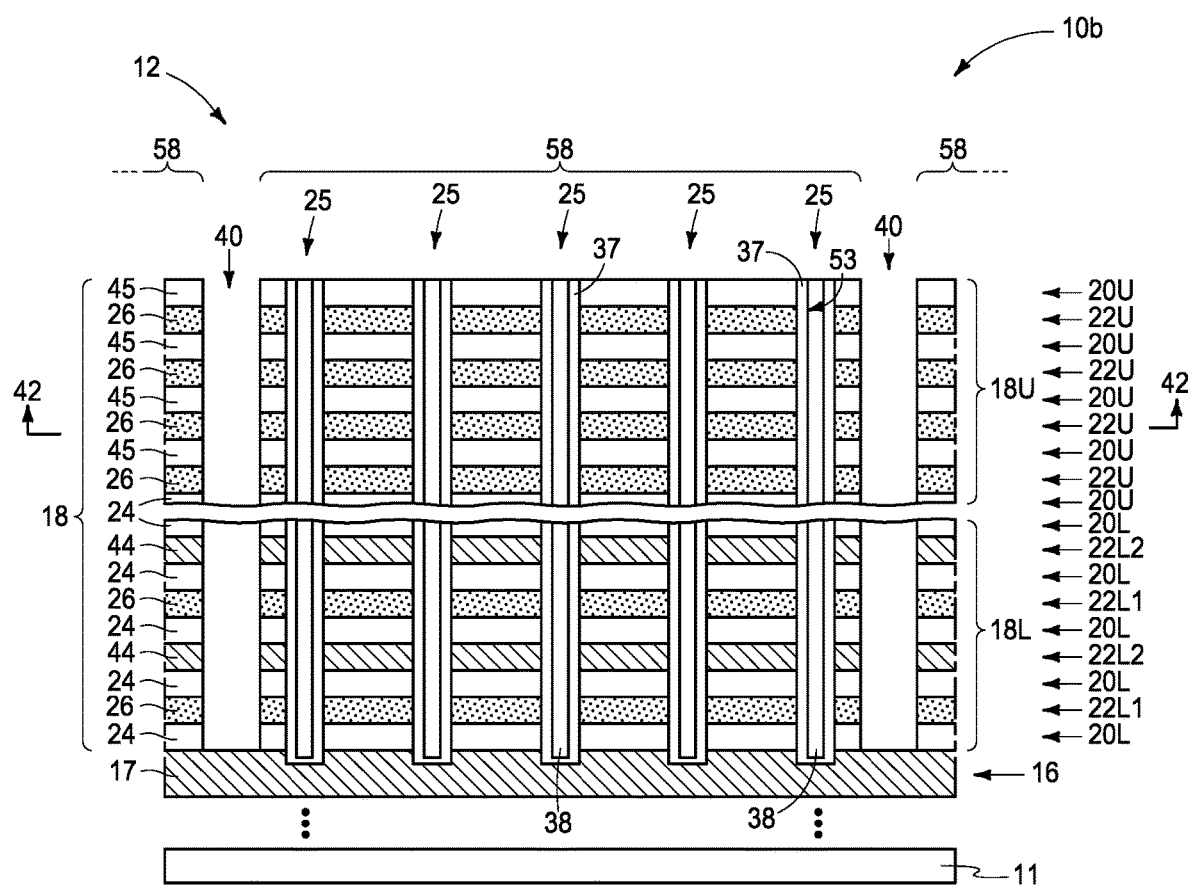

Referring to FIGS. 42 and 43, and after the replacing of sacrificial material 43 (not shown, and from FIGS. 38 and 39) with conductive material 44, vertically-alternating conductive tiers 22* and insulative tiers 20* of an upper portion 18U of stack 18* have been formed above lower portion 18L. Upper portion 18U comprises multiple upper 22U of conductive tiers 22* and multiple upper 20U of insulative tiers 20*. Upper insulative tiers 20U comprise insulating material 45 (that may be the same as insulative material 24). Upper conductive tiers 22U comprise sacrifice material 26 that is of different composition from that of conductive material 44, insulating material 45, and insulative material 24. Structures 37, 38 and trenches 40 have also been formed analogous to that described above with respect to FIGS. 4-7.

Figure 44:
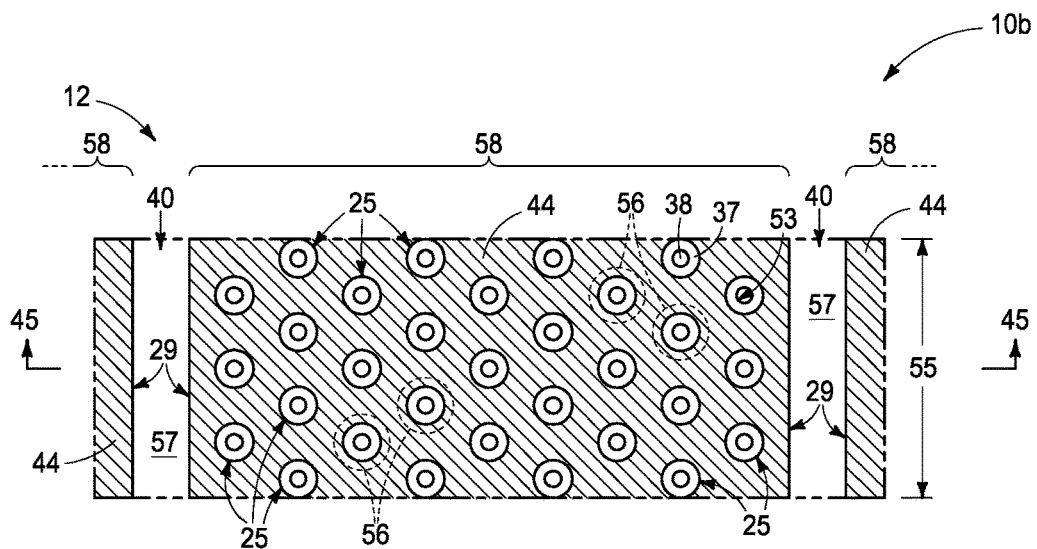
Figure 45:
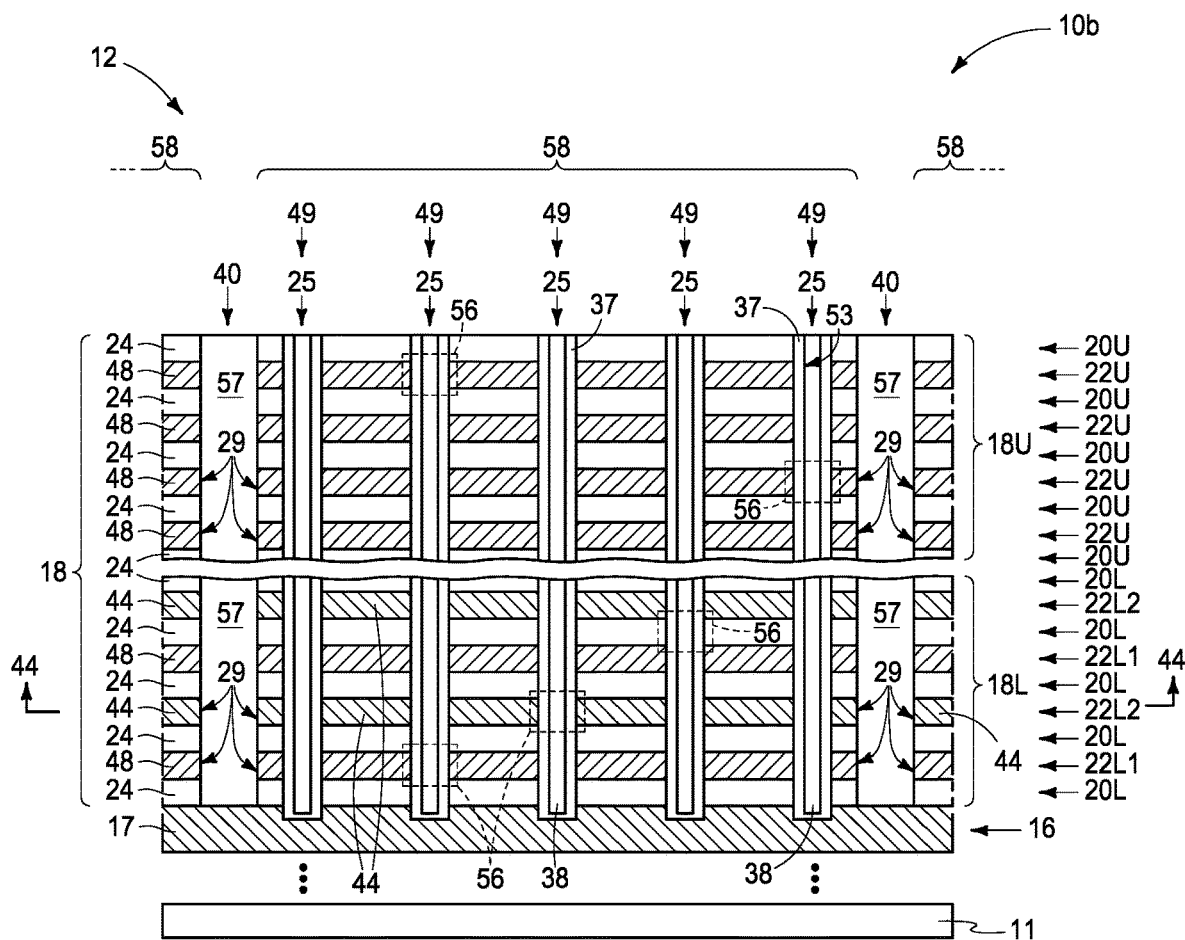

Referring to FIGS. 44 and 45, sacrifice material 26 (not shown) has been replaced with conducting material 48 (alternately, and by way of example, could have been with conductive material 44 and not shown) and, for example, subsequent processing has occurred to form a construction analogous to that described above with respect to FIGS. 22-27.

Any other attribute(s) or aspect(s) as shown and/or described herein with respect to other embodiments may be used.

In one embodiment, a method used in forming a memory array (e.g., 12) comprising strings (e.g., 49) of memory cells (e.g., 56) comprises forming a stack (e.g., 18*) comprising vertically-alternating conductive tiers (e.g., 22*) and insulative tiers (e.g., 20*). The stack comprises laterally-spaced memory-block regions (e.g., 58). A lower portion (e.g., 18L) of the stack comprises multiple lower (e.g., 22L*) of the conductive tiers and multiple lower (e.g., 20L) of the insulative tiers. The lower insulative tiers comprise insulative material (e.g., 24). The lower conductive tiers comprise lower first-sacrificial-material tiers (e.g., 22L1) that vertically alternate with lower second-sacrificial-material tiers (e.g., 22L2). The first sacrificial material, the second sacrificial material, and the insulative material are of different compositions relative one another. An upper portion of the stack comprises multiple upper (e.g., 22U) of the conductive tiers and multiple upper (e.g., 20U) of the insulative tiers. The upper conductive tiers comprise the first sacrificial material, the upper insulative tiers comprising insulating material (e.g., 24) that is of different composition from those of the first sacrificial material and the second sacrificial material. One of the first and second sacrificial materials is replaced with conducting material (e.g., 48 or 44). After the replacing of the one, the other of the first and second sacrificial materials is replaced with conductive material (e.g., 48 or 44). Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry comprises a memory array (e.g., 12) comprising strings (e.g., 49) of memory cells (e.g., 56), the memory array comprising laterally-spaced memory blocks (e.g., 58) individually comprising a first vertical stack (e.g., 18* in FIG. 23) comprising alternating insulative tiers (e.g., 20*) and conductive tiers (e.g., 22*). Strings (e.g., 49) of memory cells (e.g., 56) comprise channel-material strings (e.g., 53) that extend through the insulative tiers and the conductive tiers. The conductive tiers individually comprising a horizontally-elongated conductive line (e.g., 29). A second vertical stack (e.g., 70 in FIG. 27) is aside the first vertical stack. The second vertical stack comprises an upper portion (e.g., 18U) and a lower portion (e.g., 18L). The upper portion comprises vertically-alternating first tiers (e.g., 22U) and second insulating tiers (e.g., 20U) that are of different composition relative one another. The lower portion comprises vertically-alternating third tiers (e.g., 22L*) and fourth insulative tiers (e.g., 20L) that are of different composition relative one another. The first, second, third, and fourth tiers individually comprising a predominant material (i.e., more than 50% up to 100%/all). The predominant materials of the first, second, third, and fourth tiers collectively comprising at least three different compositions (e.g., 24, 26, and 43).

In one embodiment, the predominant materials are each conductive, in an alternate embodiment are each insulative, and in yet another alternate embodiment are a combination of insulative and conductive. In one embodiment, the predominant materials collectively are three different compositions (e.g., 24, 26, and 43) and not four different compositions. In one embodiment, the second insulating tiers and the fourth insulative tiers are of the same composition relative one another (e.g., 24). In one embodiment, the predominant materials are collectively among silicon dioxide, silicon nitride, polysilicon, a silicon-germanium alloy, metal oxide, and metal material. In one embodiment, the predominant materials are collectively among silicon dioxide, silicon nitride, and polysilicon, and in one such embodiment the polysilicon is insulative.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating conductive tiers and insulative tiers. The stack comprises laterally-spaced memory-block regions. A lower portion of the stack comprises multiple lower of the conductive tiers and multiple lower of the insulative tiers. The lower insulative tiers comprise insulative material. The lower conductive tiers comprise lower first-sacrificial-material tiers that vertically alternate with lower second-sacrificial-material tiers. The first sacrificial material, the second sacrificial material, and the insulative material are of different compositions relative one another. An upper portion of the stack comprises multiple upper of the conductive tiers and multiple upper of the insulative tiers. The upper conductive tiers comprise the first sacrificial material. The upper insulative tiers comprise insulating material that is of different composition from those of the first sacrificial material and the second sacrificial material. One of the first and second sacrificial materials is replaced with conducting material. After the replacing of the one, the other of the first and second sacrificial materials is replaced with conductive material.

In some embodiments, a method used in forming a memory array comprising strings of memory cells comprises forming a conductor tier comprising conductor material on a substrate. A lower portion of a stack is formed that will comprise vertically-alternating conductive tiers and insulative tiers above the conductor tier. The stack comprises laterally-spaced memory-block regions. The lower portion comprises multiple lower of the conductive tiers and multiple lower of the insulative tiers. The lower insulative tiers comprise insulative material. The lower conductive tiers comprise lower first-sacrificial-material tiers that vertically alternate with lower second-sacrificial-material tiers. The first sacrificial material, the second sacrificial material, and the insulative material are of different compositions relative one another. The vertically-alternating conductive tiers and insulative tiers of an upper portion of the stack are formed above the lower portion. The upper portion comprises multiple upper of the conductive tiers and multiple upper of the insulative tiers. The upper conductive tiers comprise the first sacrificial material. The upper insulative tiers comprise insulating material that is of different composition from those of the first sacrificial material and the second sacrificial material. Channel-material strings are formed that extend through the upper portion into the lower portion. Horizontally-elongated trenches are formed through the upper portion and into at least some of the lower conductive tiers. The horizontally-elongated trenches individually are between immediately-laterally-adjacent of the memory-block regions. Through the horizontally-elongated trenches, one of the first and second sacrificial materials is replaced with conducting material. After the replacing of the one and through the horizontally-elongated trenches, the other of the first and second sacrificial materials is replaced with conductive material. The replacing of the one comprises isotropically etching the one selectively relative to the other, the insulating material, and the insulative material. The replacing of the other comprises isotropically etching the other selectively relative to the insulating material, the insulative material, and the one of the conducting material or the conductive material resulting from the replacing of the one.

In some embodiments, a method used in forming a memory array comprising strings of memory cells comprises forming a lower portion of a stack that will comprise vertically-alternating conductive tiers and insulative tiers. The stack comprises laterally-spaced memory-block regions. The lower portion comprises multiple lower of the conductive tiers and multiple lower of the insulative tiers. The lower insulative tiers comprise insulative material. The lower conductive tiers comprise sacrificial material that is of different composition from that of the insulative material. The sacrificial material is replaced with conducting material. After the replacing of the sacrificial material, the vertically-alternating conductive tiers and insulative tiers of an upper portion of the stack are formed above the lower portion. The upper portion comprises multiple upper of the conductive tiers and multiple upper of the insulative tiers. The upper insulative tiers comprise insulating material. The upper conductive tiers comprise sacrifice material that is of different composition from that of the conducting material, the insulating material, and the insulative material. The sacrifice material is replaced with conductive material.

In some embodiments, integrated circuitry comprising a memory array comprises strings of memory cells comprising laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises vertically-alternating first tiers and second insulating tiers that are of different composition relative one another. The lower portion comprises vertically-alternating third tiers and fourth insulative tiers that are of different composition relative one another. The first, second, third, and fourth tiers individually comprise a predominant material. The predominant materials of the first, second, third, and fourth tiers collectively comprise at least three different compositions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry comprising a memory array comprising strings of memory cells, the memory cells individually comprising storage material, the method comprising:
   forming a stack comprising vertically-alternating tiers that at least in a finished circuitry construction of the integrated circuitry comprise conductive tiers and insulative tiers, the stack comprising laterally-spaced memory-block regions, a lower portion of the stack comprising:
      multiple lower of the conductive tiers and multiple lower of the insulative tiers, the lower insulative tiers comprising insulative material; and
      the lower conductive tiers comprising lower first-sacrificial-material tiers that vertically alternate with lower second-sacrificial-material tiers; the first sacrificial material, the second sacrificial material, and the insulative material being of different compositions relative one another;
   an upper portion of the stack comprising multiple upper of the conductive tiers and multiple upper of the insulative tiers, the upper conductive tiers comprising the first sacrificial material, the upper insulative tiers comprising insulating material that is of different composition from those of the first sacrificial material and the second sacrificial material;
      replacing one of the first and second sacrificial materials with conducting material that surrounds the storage material of multiple of the memory cells in individual of the conductive tiers; and
      after the replacing of the one, replacing the other of the first and second sacrificial materials with conducting material that surrounds the storage material of multiple of the memory cells in the individual conductive tiers.

2. The method of claim 1 wherein,
   the replacing of the one comprises isotropically etching the one selectively relative to the other, the insulating material, and the insulative material; and
   the replacing of the other comprises isotropically etching the other selectively relative to the insulating material, the insulative material, and the one of the conducting material or the conductive material resulting from the replacing of the one.

3. The method of claim 1 wherein the one is the first sacrificial material and the other is the second sacrificial material.

4. The method of claim 1 wherein the one is the second sacrificial material and the other is the first sacrificial material.

5. The method of claim 1 wherein the insulating material and the insulative material are of the same composition relative one another.

6. The method of claim 1 wherein the conducting material and the conductive material are of the same composition relative one another.

7. The method of claim 1 wherein the first sacrificial material comprises silicon nitride and the second sacrificial material comprises polysilicon.

8. The method of claim 7 wherein the insulating material and the insulative material comprise silicon dioxide.

9. A method used in forming integrated circuitry comprising a memory array comprising strings of memory cells, the memory cells individually comprising storage material, the method comprising:
   forming a conductor tier comprising conductor material on a substrate;
   forming a lower portion of a stack that will comprise vertically-alternating conductive tiers and insulative tiers above the conductor tier at least in a finished circuitry construction of the integrated circuitry, the stack comprising laterally-spaced memory-block regions, the lower portion comprising:
      multiple lower of the conductive tiers and multiple lower of the insulative tiers, the lower insulative tiers comprising insulative material; and
      the lower conductive tiers comprising lower first-sacrificial-material tiers that vertically alternate with lower second-sacrificial-material tiers; the first sacrificial material, the second sacrificial material, and the insulative material being of different compositions relative one another;
   forming the vertically-alternating conductive tiers and insulative tiers of an upper portion of the stack above the lower portion, the upper portion comprising multiple upper of the conductive tiers and multiple upper of the insulative tiers, the upper conductive tiers comprising the first sacrificial material, the upper insulative tiers comprising insulating material that is of different composition from those of the first sacrificial material and the second sacrificial material;
   forming channel-material strings that extend through the upper portion into the lower portion;
   forming horizontally-elongated trenches through the upper portion and into at least some of the lower conductive tiers, the horizontally-elongated trenches individually being between immediately-laterally-adjacent of the memory-block regions;
   through the horizontally-elongated trenches, replacing one of the first and second sacrificial materials with conducting material;
   after the replacing of the one and through the horizontally-elongated trenches, replacing the other of the first and second sacrificial materials with conductive material;
   the replacing of the one comprising isotropically etching the one selectively relative to the other, the insulating material, and the insulative material; and
   the replacing of the other comprising isotropically etching the other selectively relative to the insulating material, the insulative material, and the one of the conducting material or the conductive material resulting from the replacing of the one.

10. The method of claim 9 wherein the one is the first sacrificial material and the other is the second sacrificial material.

11. The method of claim 9 wherein the one is the second sacrificial material and the other is the first sacrificial material.

12. The method of claim 9 comprising:
   after the replacing of the one, the conducting material remains in the horizontally-elongated trenches; and
   removing at least a majority of the conducting material remaining in the horizontally-elongated trenches before the replacing of the other.

13. The method of claim 12 wherein the removing is of all of the conducting material remaining in the horizontally-elongated trenches before the replacing of the other.

14. The method of claim 12 wherein the one is the first sacrificial material and the other is the second sacrificial material.

15. The method of claim 12 wherein the one is the second sacrificial material and the other is the first sacrificial material.

* * * * *